United States Patent
Kasuga

(10) Patent No.: US 8,391,067 B2
(45) Date of Patent: Mar. 5, 2013

(54) NONVOLATILE MEMORY

(75) Inventor: Kazunori Kasuga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 249 days.

(21) Appl. No.: 12/623,553

(22) Filed: Nov. 23, 2009

(65) Prior Publication Data

US 2010/0142276 A1   Jun. 10, 2010

(30) Foreign Application Priority Data

Dec. 8, 2008  (JP) ................................. 2008-311999

(51) Int. Cl.
  *G11C 11/34*  (2006.01)
(52) U.S. Cl. .................................. 365/185.09
(58) Field of Classification Search .............. 365/185.09
  See application file for complete search history.

(56) References Cited

U.S. PATENT DOCUMENTS

| | | | |
|---|---|---|---|
| 6,108,241 | A | 8/2000 | Chevaillier |
| 6,584,019 | B1 * | 6/2003 | Chevallier ................ 365/185.33 |
| 7,286,401 | B2 | 10/2007 | Ishimaru et al. |
| 2002/0191440 | A1 | 12/2002 | Chevallier |
| 2007/0140017 | A1 | 6/2007 | Kaneko |
| 2007/0262890 | A1 | 11/2007 | Cornwell et al. |
| 2007/0271439 | A1 * | 11/2007 | Mastouri et al. ............. 711/202 |
| 2008/0175055 | A1 | 7/2008 | Kim |
| 2008/0181017 | A1 | 7/2008 | Watanabe et al. |
| 2009/0240872 | A1 * | 9/2009 | Perlmutter et al. ........... 711/103 |
| 2009/0313441 | A1 | 12/2009 | Mochida et al. |
| 2010/0195393 | A1 * | 8/2010 | Eggleston ................ 365/185.09 |

FOREIGN PATENT DOCUMENTS

| | | |
|---|---|---|
| CN | 101218567 | 7/2008 |
| JP | 60-74578 | 4/1985 |
| JP | 2000-11670 | 1/2000 |
| JP | 2002-318729 | 10/2002 |
| JP | 2003-507840 | 2/2003 |
| JP | 2007-164937 | 6/2007 |
| JP | 2008-165955 | 7/2008 |
| JP | 2008-186528 | 8/2008 |
| KR | 10-2005-0062384 | 6/2005 |
| KR | 10-0764748 | 10/2007 |

OTHER PUBLICATIONS

Korean Office Action for corresponding Korean Application 10-2009-0119811; dated Feb. 16, 2011.
Japanese Office Action issued Dec. 25, 2012 in corresponding Japanese Patent Application No. 2008-311999.
Chinese Patent Office Action mailed Aug. 2, 2012 for corresponding Chinese Patent Application No. 200910225799.3.

* cited by examiner

*Primary Examiner* — Hoai V Ho
*Assistant Examiner* — Min Huang
(74) *Attorney, Agent, or Firm* — Staas & Halsey LLP

(57) ABSTRACT

A nonvolatile memory includes a memory cell array including a plurality of memory cells, each of the memory cells capable of storing electric charges nonvolatilly, a first sense amplifier for comparing a voltage produced by one of the selected memory cells to be read out with a first threshold value for distinguishing between a write state and an erase state of the selected memory cell, a second sense amplifier for comparing the voltage produced by one of the selected memory cell with a second threshold value having a greater voltage than the first threshold voltage, and a write unit for rewriting data of the selected memory cell when the first and the second sense amplifiers produce different sense outputs from each other.

18 Claims, 34 Drawing Sheets

FIG. 6

| D7 | D6 | D5 | D4 | D3 | D2 | D1 | D0 |
|----|----|----|----|----|----|----|----|
| ... | ... | DWF | ... | ... | ... | REFR | ... |

| DATA FIELD (2K Byte) | | | | SPARE FIELD (64 Byte) | | | |
|---|---|---|---|---|---|---|---|
| SECTOR A | SECTOR B | SECTOR C | SECTOR D | SPARE a | SPARE b | SPARE c | SPARE d |
| 512 Byte | 512 Byte | 512 Byte | 512 Byte | 16 Byte | 16 Byte | 16 Byte | 16 Byte |

| 1st Byte | 2nd Byte | ... | 512th Byte |
|---|---|---|---|
| Fixed '0' | User Data | ... | User Data |

FIG. 8

DATA FIELD (2K Byte)

| SECTOR A | SECTOR B | SECTOR C | SECTOR D |
|---|---|---|---|
| 512 Byte | 512 Byte | 512 Byte | 512 Byte |

SPARE FIELD (64 Byte)

| SPARE a | SPARE b | SPARE c | SPARE d |
|---|---|---|---|
| 16 Byte | 16 Byte | 16 Byte | 16 Byte |

| 1st Byte | 2nd Byte | 3rd Byte | 4th Byte | 5th Byte | 6th Byte | 7th Byte | 8th Byte | 9th Byte | 10th Byte | 11th Byte | 12th Byte | 13th Byte | 14th Byte | 15th Byte | 16th Byte |
|---|---|---|---|---|---|---|---|---|---|---|---|---|---|---|---|
| BBI | DV | LSN0 | LSN1 | LSN1 | LSN2 | RSV | RC | RSV | ECC0 | ECC1 | ECC2 | ECCS0 | ECCS1 | RSV | RSV |

| Function | 1st Cycle | 2nd Cycle | |
|---|---|---|---|
| Read with Main SA | 00h | 30h | ... |
| Read with Sub SA | 00h | 31h | ... |
| ... | | | |

FIG. 18

| Function | 1st Cycle | 2nd Cycle |
|---|---|---|
| Read with Main SA | 00h | 30h |
| Read with Sub SA | 00h | 31h |
| Rewrite to Current Block | 50h | 10h |
| ... | ... | ... |

| Function | 1st Cycle | 2nd Cycle |
|---|---|---|
| Read with Main SA | 00h | 30h |
| Read with Sub SA | 00h | 31h |
| Refresh to Current Block | 50h | 10h |
| Refresh to Replacement Block | 55h | 10h |

40b

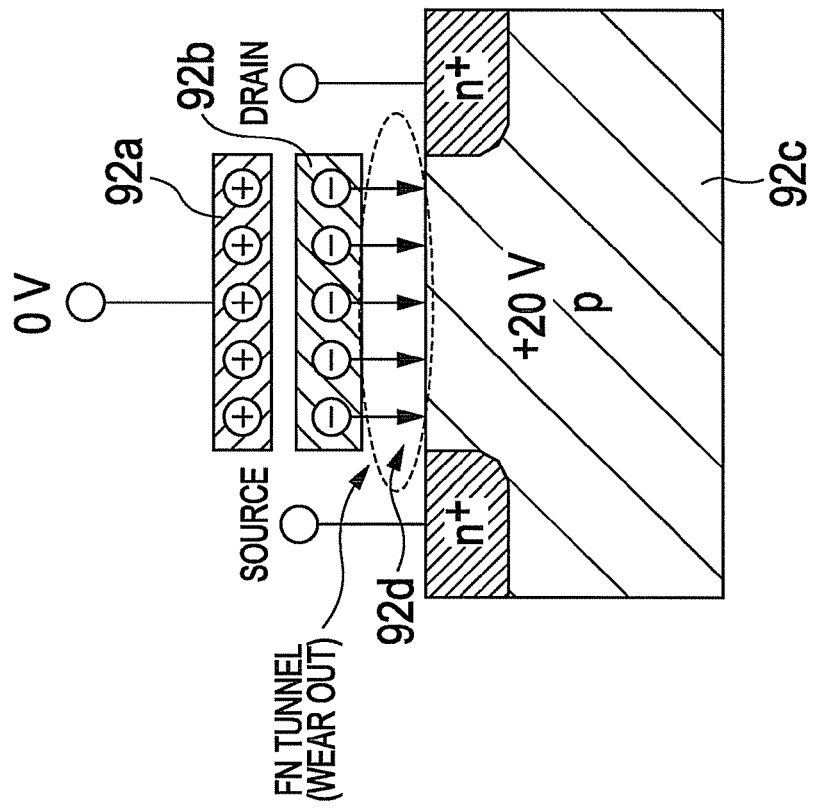
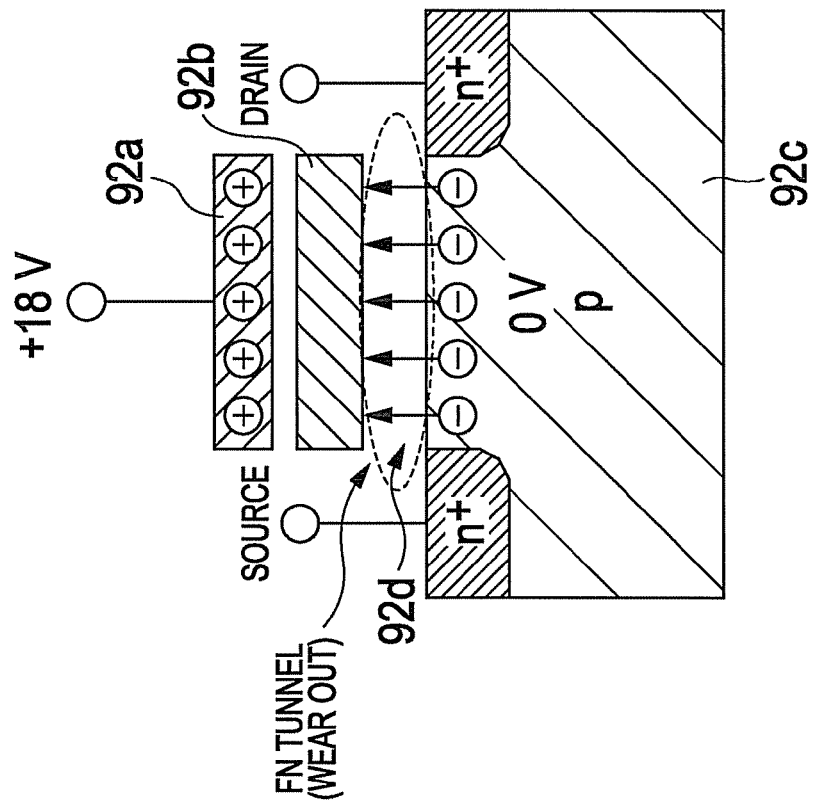

NONVOLATILE MEMORY

CROSS-REFERENCE TO RELATED APPLICATION

This application is based upon and claims the benefit of priority of the prior Japanese Patent Application No. 2008-311999 filed on Dec. 8, 2008, the entire contents of which are incorporated herein by reference.

FIELD

An aspect of the embodiments discussed herein is directed to a nonvolatile memory.

BACKGROUND

In recent years, memory devices with a USB (Universal Serial Bus) memory, a flash memory card, or other such nonvolatile memories have been widely used for reasons of large capacity, nonvolatile property, and low power consumption.

A reliability of long-term data storage is required of these memory devices. In addition, demands for memory devices of larger capacity grow along with an increase in data size such as an image or a moving picture. Then, reduction of a process for a nonvolatile memory has been actively performed.

FIG. 33 is a circuit diagram illustrating the basic cell structure of a NAND nonvolatile memory. A nonvolatile memory (Nonvolatile memory) 90 has plural NAND cells (Cells) (memory transistors) 92 in a NAND cell group 91 connected in series.

Any NAND cell 92 is selected by a select gate (Select Gate) 93. Further, erasing is carried out for each NAND cell group 91. Each NAND cell 92 includes a control gate (Control Gate) 92a and a floating gate (Floating Gate) 92b.

FIG. 34A and FIG. 34B illustrate how data is written/erased to/from a nonvolatile memory. FIG. 34A illustrates how data is written to the nonvolatile memory. The floating gate 92b is insulated from the control gate 92a and a substrate (Substrate) 92c through a gate oxide film (Gate oxide) 92d and assumed electrically floating.

However, if a high voltage is applied between the control gate 92a and the substrate 92c, charges may be injected to the floating gate 92b from the substrate 92c through the gate oxide film 92d due to FN (Fowler-Nordheim) tunnel phenomenon.

Since the floating gate 92b is in an electrically floating state, charges may be held even when the power is turned off. The injection of charges is generally called "write" or "program (Program)".

Further, as illustrated in FIG. 34B, if a high-voltage is applied in an opposite direction to the write direction, the charges injected into the floating gate 92b may be similarly released to the substrate 92c through the gate oxide film 92d due to the FN tunnel phenomenon. The release of charges is generally called "clear" or "erase (Erase)".

In general, the NAND nonvolatile memory is assumed in write state (logic "0") when charges are injected and in erase state when charges are released (logic "1"). Accordingly, Japanese Laid-open Patent Publication No. 2007-164937 discusses a technique that a memory cell of nonvolatile semiconductor memory device stores one data value selected from the same number of data values as programming distribution ranges, the one data value being associated with the electrical attribute belonging to any one of the more than one programming distribution ranges.

SUMMARY

According to an aspect of an embodiment, a nonvolatile memory includes a memory cell allay including a plurality of memory cells, each of the memory cells capable of storing electric charges nonvolatilly, a first sense amplifier for comparing a voltage produced by one of the selected memory cells to be read out with a first threshold value for distinguishing between a write state and an erase state of the selected memory cell, a second sense amplifier for comparing the voltage produced by one of the selected memory cell with a second threshold value having a greater voltage than the first threshold voltage, and a write unit for rewriting data of the selected memory cell when the first and the second sense amplifiers produce different sense outputs from each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 6 illustrates a configuration example of a status register;

FIG. 7 illustrates the page structure;

FIG. 8 illustrates the page structure;

FIG. 9 illustrates a command function supplied to a nonvolatile memory;

FIG. 18 illustrates a command function of the nonvolatile memory of the third embodiment;

FIG. 22 illustrates a command function of the nonvolatile memory of the fourth embodiment;

FIG. 34A and FIG. 34B illustrate how data is written to or erased from a nonvolatile memory;

DESCRIPTION OF EMBODIMENTS

Figure 35A:
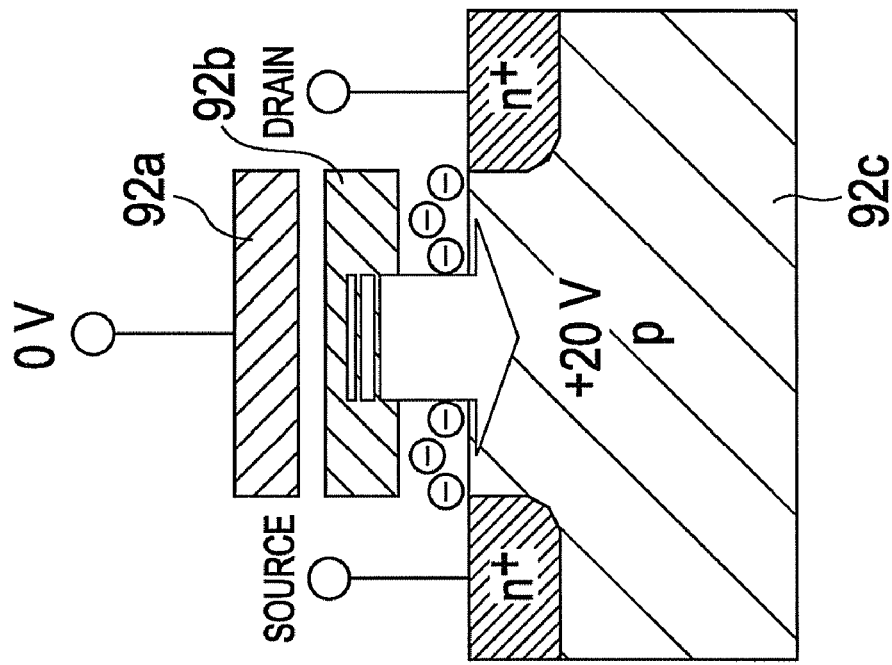
FIG. 35A and FIG. 35B illustrate how a gate oxide film degrades due to a FN tunnel phenomenon.
Figure 35B:
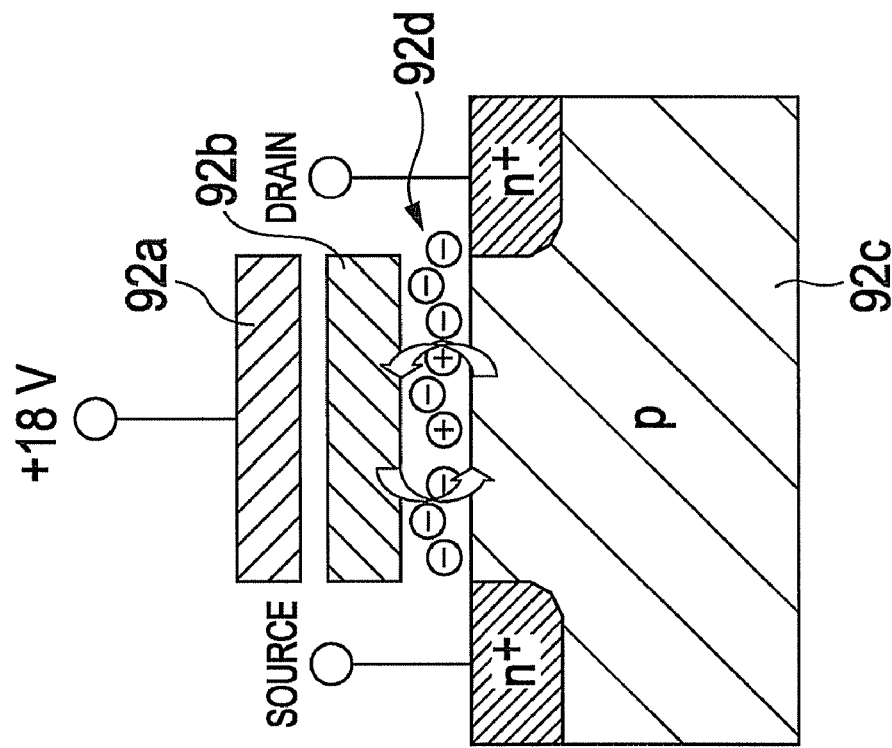

As described previously, since data is written/erased to/from the NAND nonvolatile memory utilizing a FN tunnel current, memory cells are degraded upon each write and erase. FIG. 35A and FIG. 35B illustrate how a gate oxide film degrades due to the FN tunnel phenomenon.

The FN tunnel phenomenon may induce movement of charges through the gate oxide film 92d by applying a high voltage but a small amount of charges are sometimes trapped into the gate oxide film 92d. The number of write operations increases thereby, resulting in degradation of the gate oxide film 92d and increase of a leak current (Increase of Leak Current).

An amount of leak current flowing between the floating gate 92b and the substrate 92c increases due to the degradation of the gate oxide film 92d, and charges may not be held. This phenomenon imposes a limitation on the number of times data is written/erased to/from a nonvolatile memory (hereinafter referred to as the number of write operations) as a general rule. Then, data storage capacity is reduced in proportion to the number of write operations.

Embodiments of the present invention will be illustrated below in detail with reference to the accompanying drawings.

Figure 36:
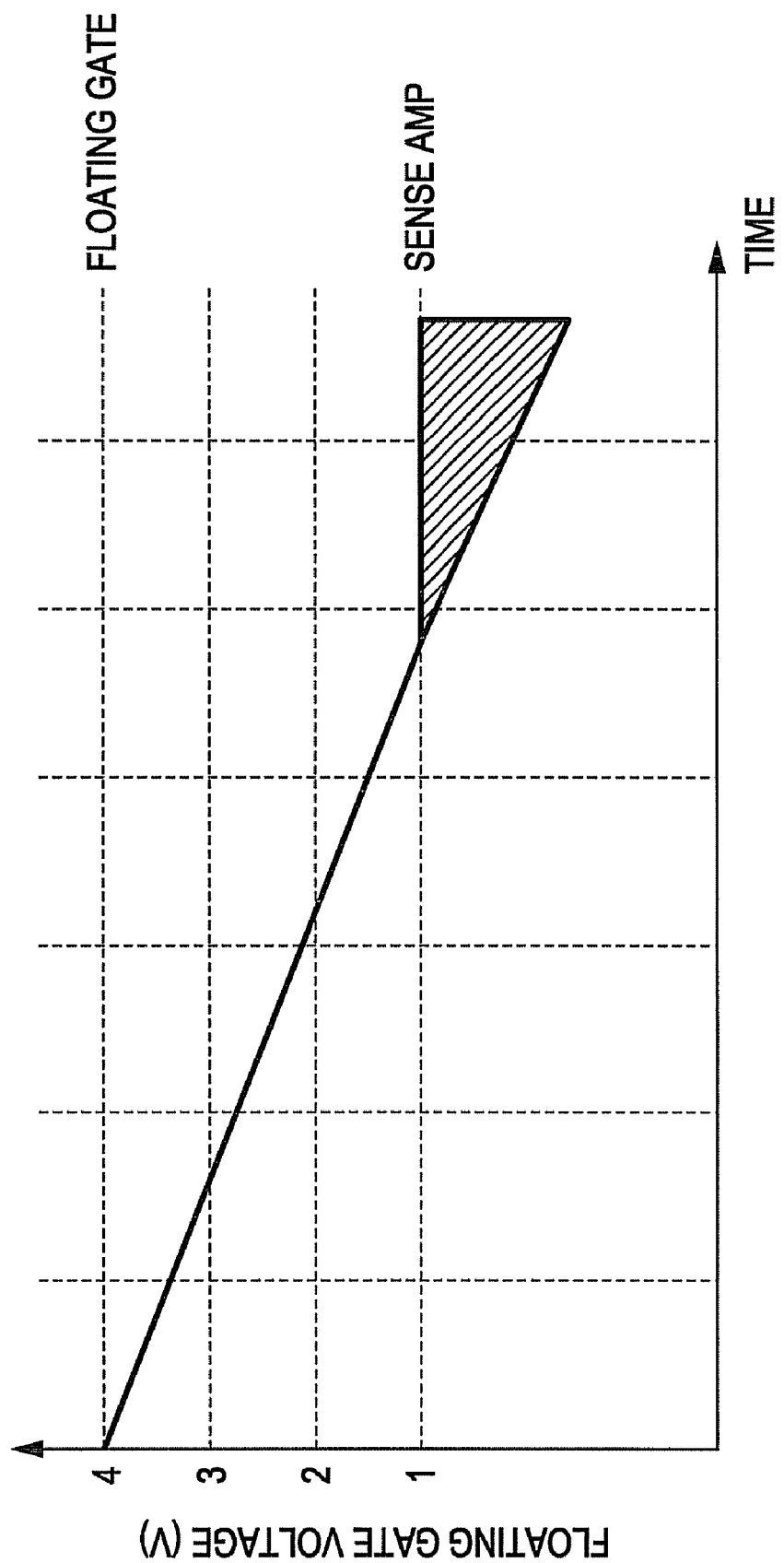
FIG. 36 is a graph illustrating a relationship between an elapsed time and a voltage change of a floating gate.

FIG. 36 is a graph illustrating a relationship between an elapsed time and a voltage change of a floating gate. It is assumed that a voltage level of the floating gate in the erase state of the NAND nonvolatile memory is 4 V, and a preset value of a sense amplifier (SA) for distinguishing between the write state and the erase state is 1 V by way of example.

As described above, a voltage level of the floating gate is gradually reduced over time due to a leak current between the floating gate and the substrate. In FIG. 36, the sense amplifier determines whether the data logic is "1" or "0" based on whether the voltage of the floating gate is 1 V or more. Accordingly, the logic of the NAND cell is inverted with time, leading to a read error.

Figure 37:
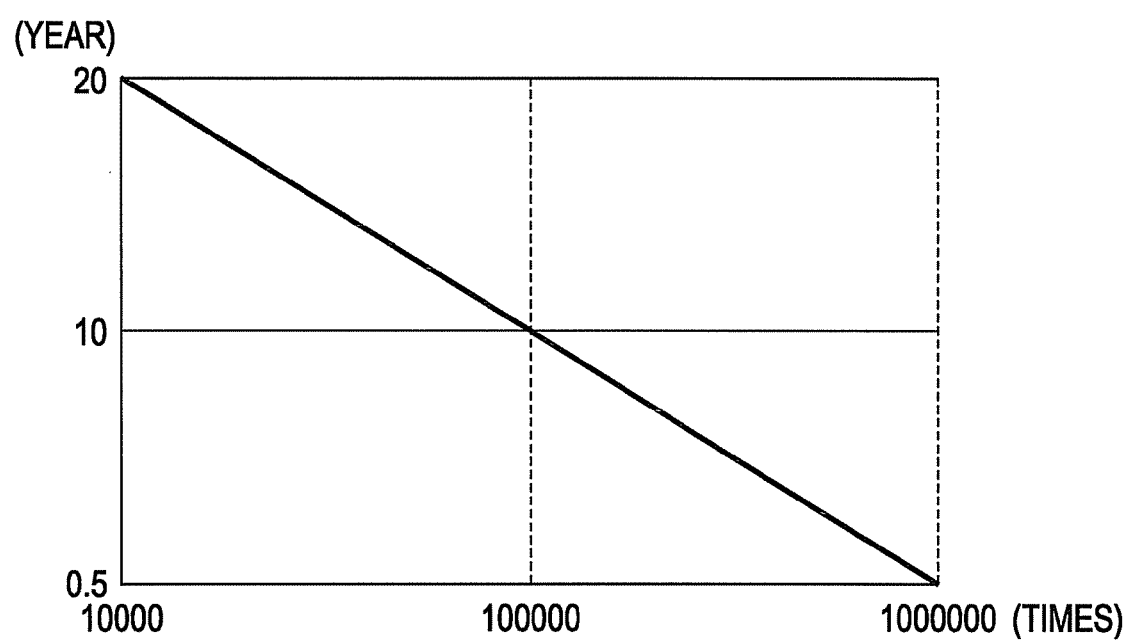
FIG. 37 is a graph illustrating a relationship between the number of write operations and data storage time.

FIG. 37 is a graph illustrating a relationship between the number of write operations and data storage time. At $10,000^{th}$ write operation, data may be held for about 20 years. After that, however, the data storage time is reduced in proportion to the number of write operations. After 100,000 write operations, data may be held for 10 years. At $1,000,000^{th}$ write operation, data may be held for only 0.5 years.

A manufacturing process is proceeding to finer ones with an aim to reducing costs and increasing a capacity. However, the thickness of the gate oxide film is not largely changed, and a voltage necessary for write or erase is not largely changed as well. Thus, a voltage applied to the gate oxide film is relatively increased, which causes problems that degradation occurs more obviously as the process proceeds to finer ones, and data storage capacity is accordingly reduced.

Therefore, a nonvolatile memory requested to store data at low price in large amounts, and for a long time needs to be prevented from reducing data storage capacity due to a finer manufacturing process. Next, a nonvolatile memory of the embodiment is described. Then, the embodiment is described in more detail.

Figure 1:
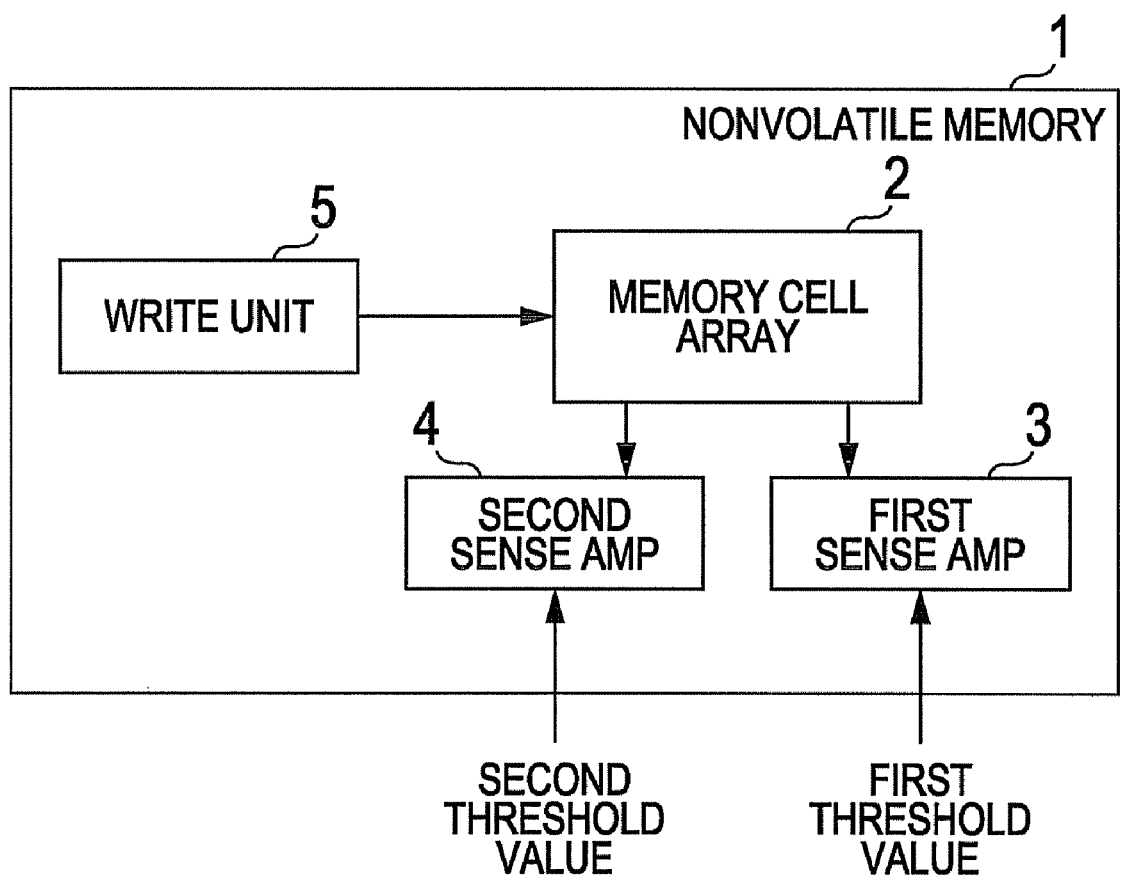
FIG. 1 schematically illustrates a nonvolatile memory according to an embodiment.

FIG. 1 schematically illustrates a nonvolatile memory of the embodiment. A nonvolatile memory 1 includes a memory cell array 2, a first sense amplifier 3, a second sense amplifier 4, and a write unit 5.

The memory cell array 2 includes plural memory cells with a floating gate. The first sense amplifier 3 compares a voltage value of a floating gate with a threshold value for distinguishing between a write state and erase state of each memory cell.

The second sense amplifier 4 compares a voltage value of a floating gate with a threshold value for distinguishing between a write state and erase state of each memory cell. Here, as illustrated in FIG. 1, the first threshold value and the second threshold value may be externally input or generated in the nonvolatile memory 1.

The write unit 5 rewrites data of a memory cell with a floating gate a voltage value of which is smaller than the second threshold value as a result of determination with the second sense amplifier 4.

Since the thus-structured nonvolatile memory 1 keeps a write state of a memory cell having a voltage value lower than the second threshold value, a reliability of data may be improved. The embodiment is described in more detail below.

Figure 2:
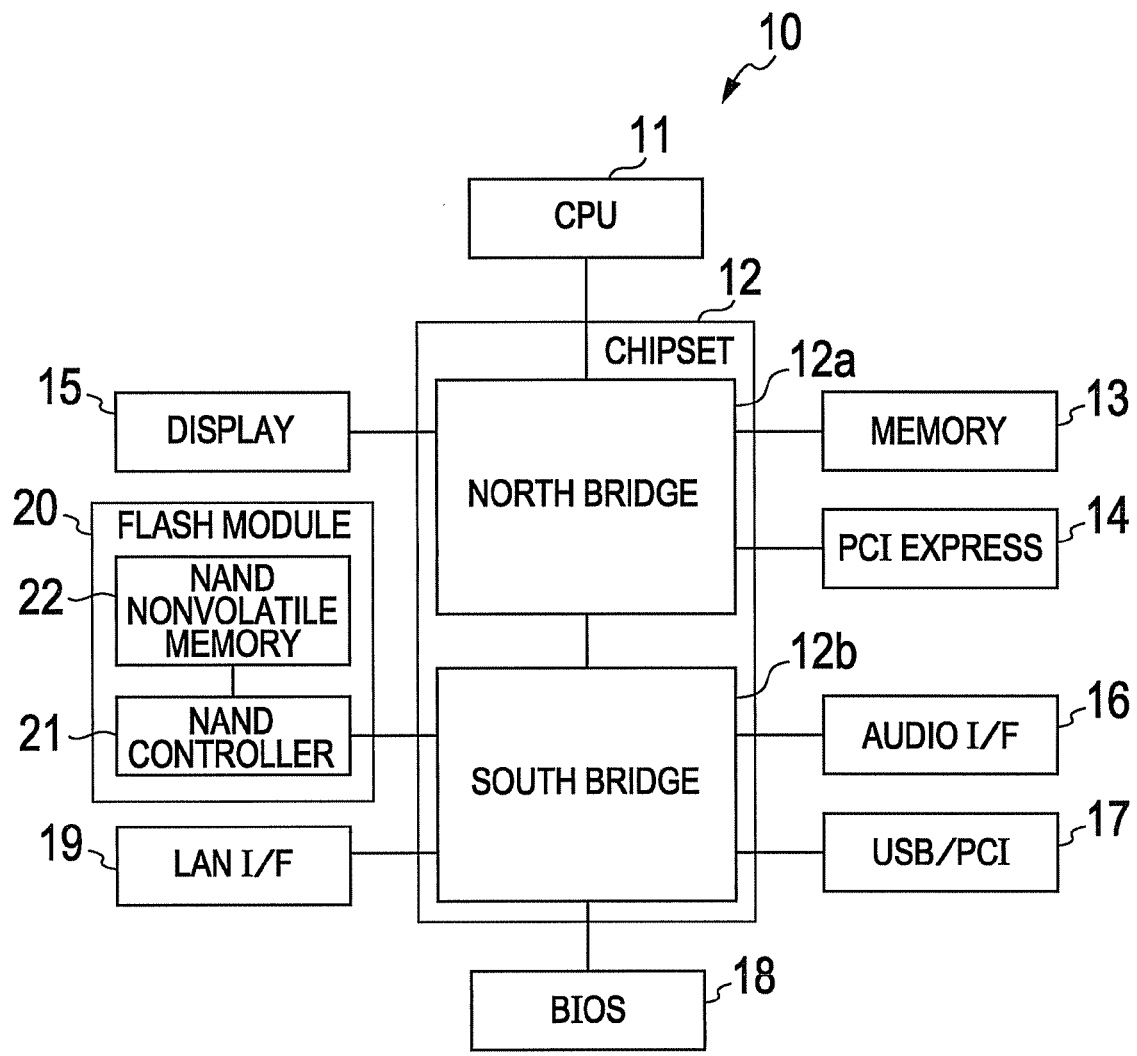
FIG. 2 illustrates a hardware structure example of a module according to the embodiment.

FIG. 2 illustrates a hardware structure example of a module of the embodiment. A module (Module) 10 is entirely controlled by a CPU (Central Processing Unit) 11. The CPU 11 is connected to a chipset (Chipset) 12.

The chipset 12 includes a north bridge (North Bridge) 12a and a south bridge (South Bridge) 12b. The north bridge 12a is connected to peripheral devices operating at relatively high speed and designed to exchange data with the devices. In FIG. 2, a memory (Memory) 13, a PCI Express 14, and a display (Display) 15 are connected thereto.

The memory 13 temporarily stores at least a part of programs of an OS (Operating System) and application programs executed on the CPU 11. In addition, the memory 13 stores various kinds of data necessary for processing on the CPU 11.

The north bridge 12a displays an image on a screen of the display 15 in accordance with a command from the CPU 11. The south bridge 12b is connected to peripheral devices operating at relatively low speed. In FIG. 2, an audio interface (Audio I/F) 16, a USB/PCI 17, a BIOS 18, a LAN interface 19, and a nonvolatile module (Nonvolatile module) 20 are connected thereto.

The nonvolatile module 20 includes a NAND controller (NAND Controller) 21, and a NAND nonvolatile memory (NAND Flash Memory IC) 22 (hereinafter simply referred to as "nonvolatile memory") connected to the NAND controller 21.

The NAND controller 21 selects any area in the nonvolatile memory 22 and validates data in the selected area. The data is validated based on ECC information in data of a management area associated with the selected area.

The nonvolatile memory 22 stores an OS or application programs. The nonvolatile memory 22 further stores program files. Here, the present invention is not limited to the configuration in FIG. 22, and the north bridge 12a and the south bridge 12b may be integrated into one chip. Further, the NAND controller 21 and the nonvolatile memory 22 may be independently provided.

Further, a not-illustrated HDD (Hard Disk Drive) may be provided independently of the nonvolatile module 20. A processing function of this embodiment is realized by the above hardware structure.

Figure 3:
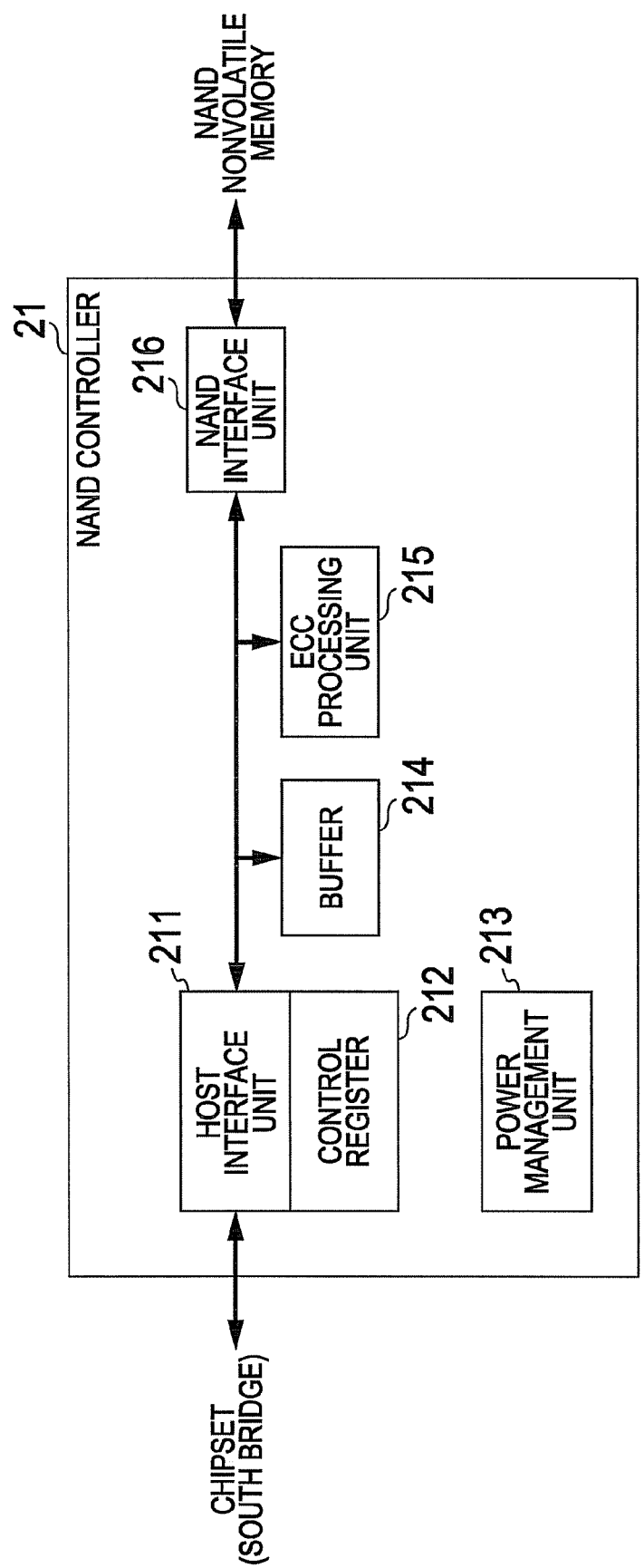
FIG. 3 is a block diagram illustrating the configuration of a NAND controller.

FIG. 3 is a block diagram illustrating the configuration of the NAND controller. The NAND controller 21 includes a host interface unit (Host Interface Unit) 211, a control register (Control Register) 212, a power management unit (Power Management Unit) 213, a buffer (Buffer) 214, an ECC processing unit 215, and a NAND interface unit (NAND Interface Unit) 216.

The host interface unit 211 communicates with the CPU 11. The control register 212 stores a command from the CPU 11 and illustrates a state of the NAND controller 21.

The power management unit 213 supplies power to the entire NAND controller 21. The buffer 214 temporarily stores data exchanged between the CPU 11 and the nonvolatile memory 22.

The ECC processing unit 215 generates an ECC from data, and performs encoding/decoding with the ECC and error correction processing. The NAND interface unit 216 communicates with the nonvolatile memory 22.

Figure 4:
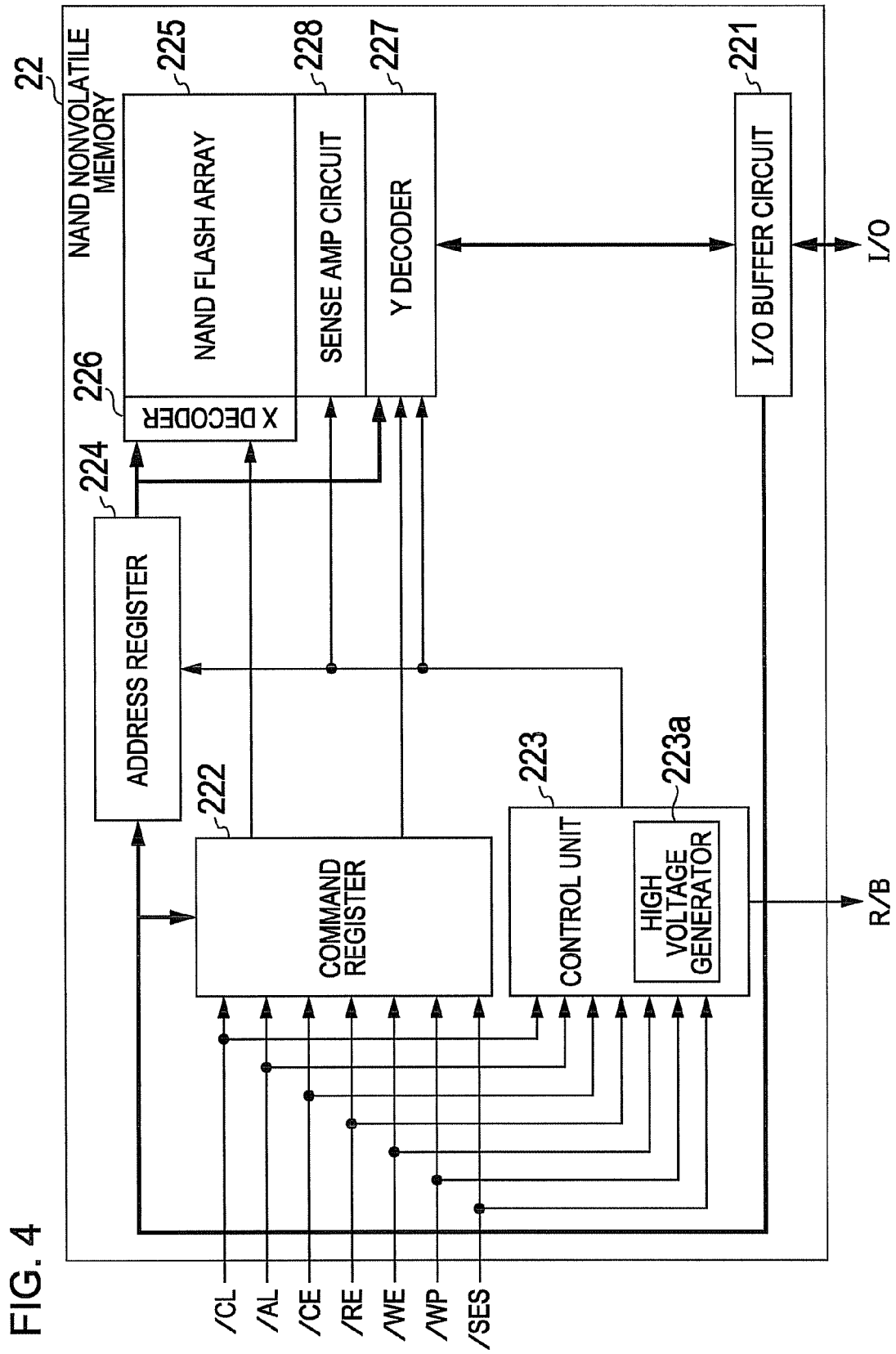
FIG. 4 is a block diagram illustrating the configuration of a nonvolatile memory.

FIG. 4 is a block diagram illustrating the structure of the nonvolatile memory. The nonvolatile memory 22 includes an I/O buffer circuit (I/O Buffer Circuit) 221, a command register (Command Register) 222, a control unit (Control Logic) 223, an address register (Address Register) 224, a NAND flash array (NAND Flash Array) 225, an X decoder (X Decoder) 226, a Y decoder (Y Decoder) 227, and a sense amplifier circuit (Sense Amplifier Circuit) 228.

The I/O buffer circuit 221 receives various commands and address signals, and data to be written to the NAND flash array 225, and outputs data read from the NAND flash array 225 and then latched.

The command register 222 latches an input command and determines an internal operation based on data of the input signal. As for "Lo active" signals, "/" is prefixed to a signal name.

"/CL" denotes a signal for selecting the command register 222 or the control unit 223. "/AL" denotes a signal for selecting an address register or data register of the nonvolatile memory 22.

"/CE" denotes a signal for selecting an active mode or standby mode of the nonvolatile memory 22. "/RE" denotes a signal for prompting data output.

"/WE" denotes a read/write instruction signal, which is shifted to a write mode when in active state. "/WP" denotes a signal for forcedly inhibiting write and erase operations. "/SES" denotes a control signal for selecting one of a main sense amplifier and a sub sense amplifier as described below to allow output of the selected amplifier.

The control unit 223 reads data from, writes data to, and erases data from each memory cell in the nonvolatile memory 22 based on input signals. In addition, the control unit 223 includes a high voltage generator (High voltage generator) 223a. The high voltage generator 223a applies a drive voltage to the X decoder 226 and the NAND flash array 225.

Further, the control unit 223 outputs an R/B signal for notifying any external unit of an internal operation of the control unit 223. The address register 224 generates a row address and column address at which data is to be read, written, and erased, based on the input address signal, and when in page mode, automatically increments the address.

The X decoder 226 decodes the row address output from the address register 224 and selects a word line (not illustrated) of the memory cell in the NAND flash array 225. The Y decoder 227 decodes the column address output from the address register 224 and reads/writes data from/to the memory cell through the selected data line (not illustrated).

The sense amplifier circuit 228 uses a main sense amplifier as described below to receive data in a memory cell selected through column selection and positioned at an intersection with a word line selected through row selection, and sends the data to the I/O buffer circuit 221. In the case of writing data, a word line in a row selected in the same manner as above and a memory cell connected to the sense amplifier circuit 228 selected by the X decoder 226 are used, and information input from the data line through a data input circuit is written to the memory cell of the NAND flash array 225.

Figure 5:
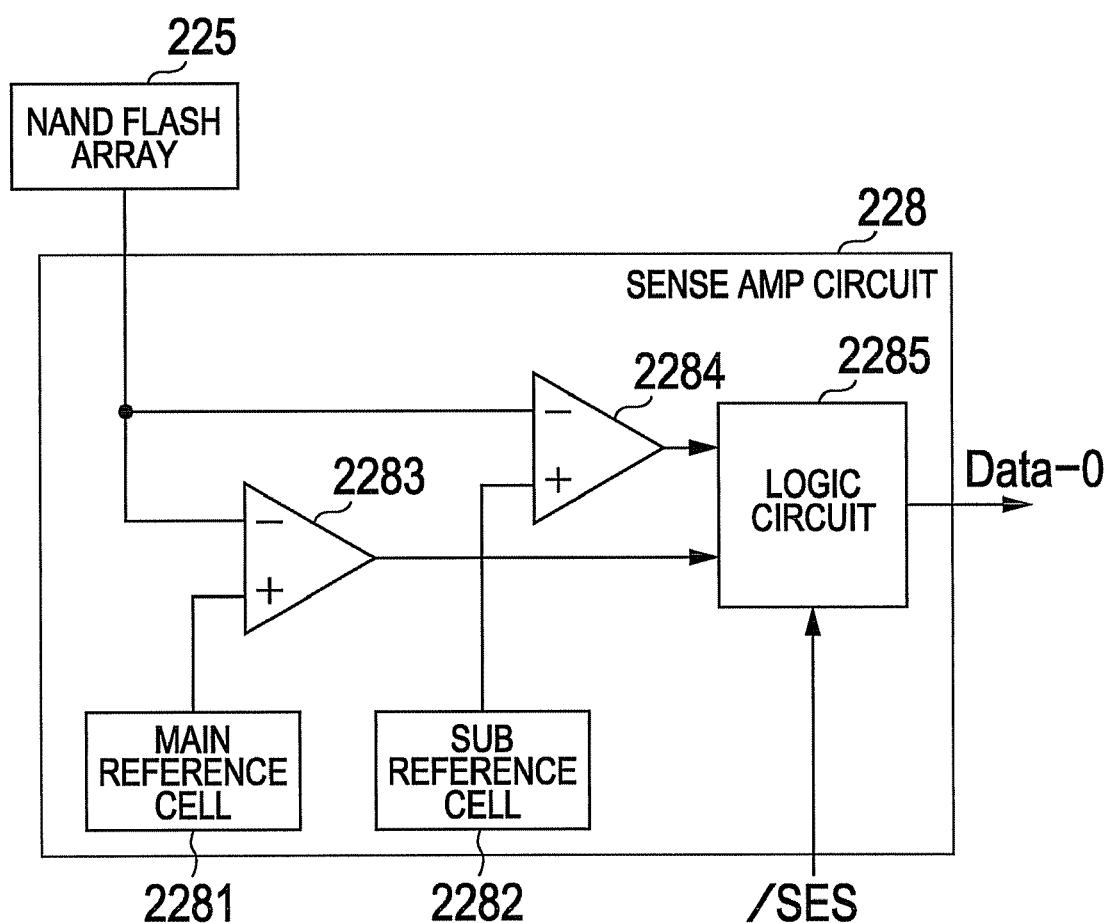
FIG. 5 is a block diagram illustrating the configuration of a sense amplifier circuit.

FIG. 5 is a block diagram illustrating the configuration of the sense amplifier circuit. The sense amplifier circuit 228 includes a main reference cell (Main Reference Cell) 2281, a sub reference cell (Sub Reference Cell) 2282, a main sense amplifier (first sense amplifier) 2283, a sub sense amplifier (second sense amplifier) 2284, and a logic circuit (Logic Circuit) 2285.

The main reference cell 2281 applies a voltage of 1 V to the main sense amplifier 2283. The sub reference cell 2282 applies a voltage of 2 V (a voltage higher than the voltage applied with the main reference cell 2281) to the sub sense amplifier 2284.

The main sense amplifier 2283 is a current detection type sense amplifier, which is used to read/write/erase data from/to/from the NAND flash array 225. For example, during a data read operation, an output current of the NAND flash array 225 is compared with a current flowing through the main reference cell 2281 to output logic of the comparison result to the logic circuit 2285. More specifically, if the output current of the NAND flash array 225 is larger than or equal to the target current, the logic "1" is output. If the current flowing through the main reference cell 2281 is larger, the logic "0" is output.

The sub sense amplifier 2284 is a current detection type sense amplifier, which is used to measure a margin. The sub sense amplifier 2284 compares an output current of the NAND flash array 225 with a current flowing through the sub reference cell 2282 and outputs logic of the comparison result to the logic circuit 2285. To be specific, if the output current of the NAND flash array 225 is larger than or equal to the target current, the logic "1" is output. If the current flowing through the sub reference cell 2282 is larger, the logic "0" is output.

The logic circuit 2285 selects one of an output signal of the main sense amplifier 2283 and an output signal of the sub sense amplifier 2284 in response to input of the "/SES" signal, and outputs the selected signal Data-0. As a result, general reading/writing/erasing operations and a margin measuring operation may be switched. In other words, the main sense amplifier 2283 is selected for the general reading/writing/ erasing operations, and the sub sense amplifier 2284 is periodically selected to check a voltage level of a floating gate.

Then, if the voltage level of the floating gate is below the voltage of 2 V applied by the sub reference cell 2282, data is held through rewriting. Here, such processing of the sub sense amplifier 2284 is performed through refresh processing as described below.

Next, a configuration example of a status register in the NAND controller 21 is described. FIG. 6 illustrates a configuration example of a status register. A status register 30 is an 8-bit register. In FIG. 6, a value indicating that refresh processing is being executed is set (set) in the first bit (REFR) of the first sense amplifier 30. For example, if "1" is set in REFR, refresh processing is being executed. If "0" is set, no refresh processing is executed.

Further, "1" is set in the fifth bit (DWF) when a write error occurs in the nonvolatile memory 22. Next, the data structure of the NAND flash array 225 is described.

The inside of the NAND flash array 225 is managed on the basis of plural blocks. One block includes plural pages. FIGS. 7 and 8 illustrate the page structure.

The write unit in the nonvolatile memory 22 is 2 KByte. The write unit includes four pages each set to 528 bytes. One page includes a sector (Sector) of 512 bytes and a spare (Spare) of 16 bytes.

Four sectors A, B, C, and D constitute a data field (Data Field) of 2 Kbytes. Further, four spares a, b, c, and d constitute a spare field (Spare Field) of 64 bytes.

The spare a is a spare area of the sector A, the spare b is a spare area of the sector B, the spare c is a spare area of the sector C, and the spare d is a spare area of the sector D.

Here, at the time of writing data, data is written such that the logic of the first byte of the sector A is fixed to "0". As for the second byte to $512^{th}$ byte, user data is written. Refresh processing is performed by checking a voltage value of the first byte of the sector A.

By fixing the logic of the first byte to "0" as above, a corresponding cell is degraded stably (at a constant speed). Thus, a margin may be measured with high accuracy. As illustrated in FIG. 8, each spare (in FIG. 8, spare E) includes preset areas such as LSN (Logical Sector Number), DV (Data validity), BBI (Bad Block Information), ECC (ECC Code for Data Field), ECCS (ECC Code for Spare Field), RSV (Reserved Area), and RC (Refresh Counter).

Among those, a refresh counter of $8^{th}$ byte, the number of times refresh processing is performed is stored. FIG. 9 illustrated a command function supplied to the nonvolatile memory.

In a command function table 40, columns of function (Function), a first cycle ($1^{st}$ cycle), and a second cycle ($2^{nd}$ cycle) are set. Information in each record are associated with one another.

A command is input in two steps, the first cycle and the second cycle, to the I/O buffer circuit 221 in a serial manner. The command input in the serial manner is transferred to the command register 222. Thus, the main sense amplifier 2283 or the sub sense amplifier 2284 may be selected without adding an input terminal to an external terminal.

To be specific, a read operation (Read with Main SA) of the main sense amplifier 2283 is performed by sending a command code "00h" at the first cycle and a command code "30h" at the second cycle.

Further, a read operation (Read with Sub SA) of the sub sense amplifier 2284 is performed by sending a command code "00h" at the first cycle and a command code "31h" at the second cycle.

Further, the command codes "30h" and "31h" are given for illustrative purposes, and another code may be assigned. Next, a description is made of refresh processing performed with the nonvolatile memory 22 in response to an instruction from the NAND controller 21.

Figure 10:
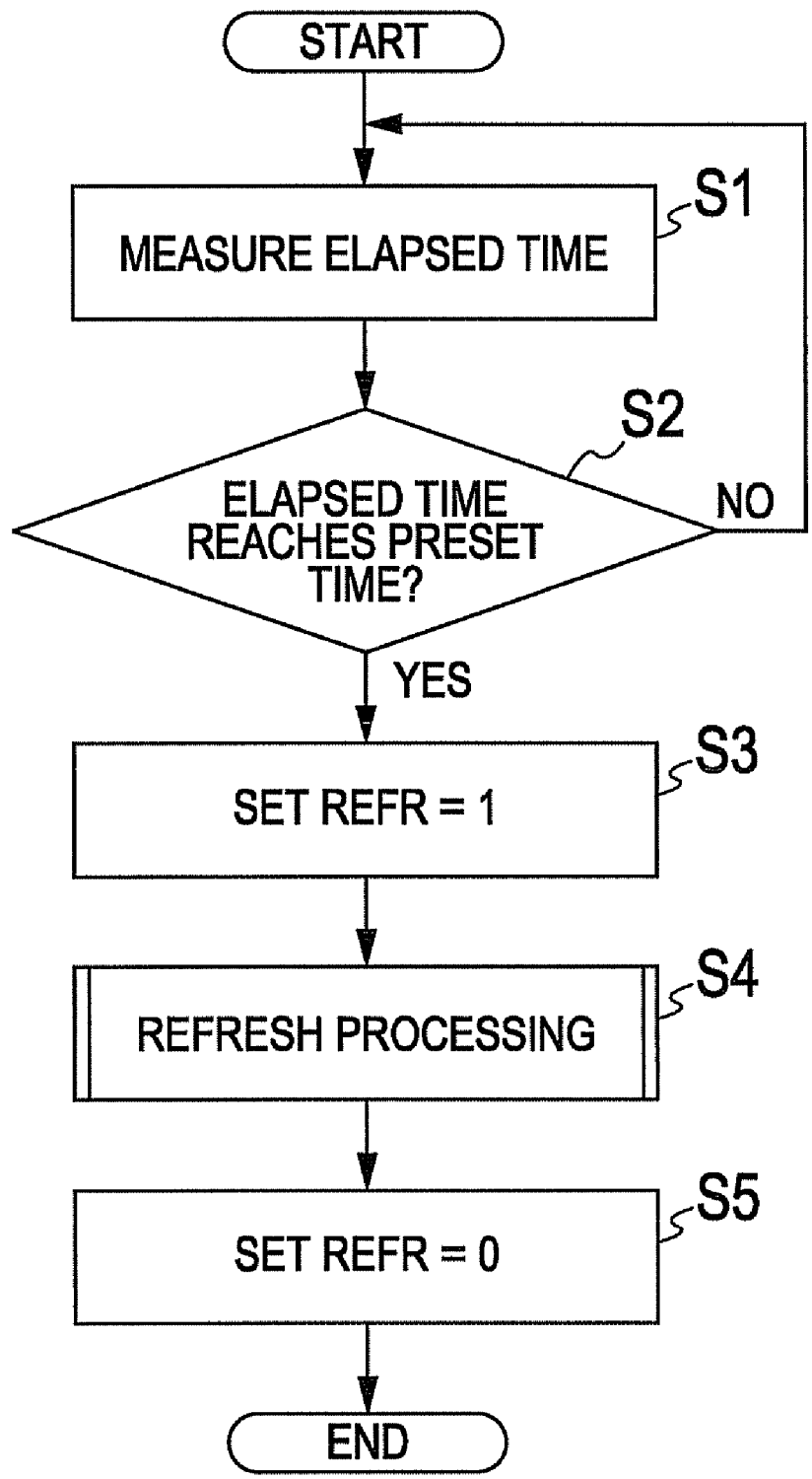
FIG. 10 is a flowchart illustrating processing for determining whether to execute refresh processing.

FIG. 10 is a flowchart illustrating processing for determining whether to execute refresh processing. First, the NAND controller 21 measures an elapsed time with a clock of the CPU 11 (step S1).

Then, it is determined whether the elapsed time reaches a preset time (whether to execute refresh processing) (step S2). The elapsed time is a time from previous refresh processing.

If the elapsed time does not reach a preset time (No in step S2), the processing shifts to step S1, and step S1 and subsequent steps are performed. On the other hand, if the elapsed time reaches a preset time (YES in step S2), "1" is set in "REFR" of the status register 30 (step S3).

Next, refresh processing is performed (step S4). After the completion of refresh processing, "0" is set in "REFR" of the status register 30 (step S5).

That is the end for the description about the processing for determining whether to execute refresh processing. Here, an instruction may be issued to prompt the CPU 11 to execute refresh processing at a predetermined timing instead of the above processing.

Figure 11:
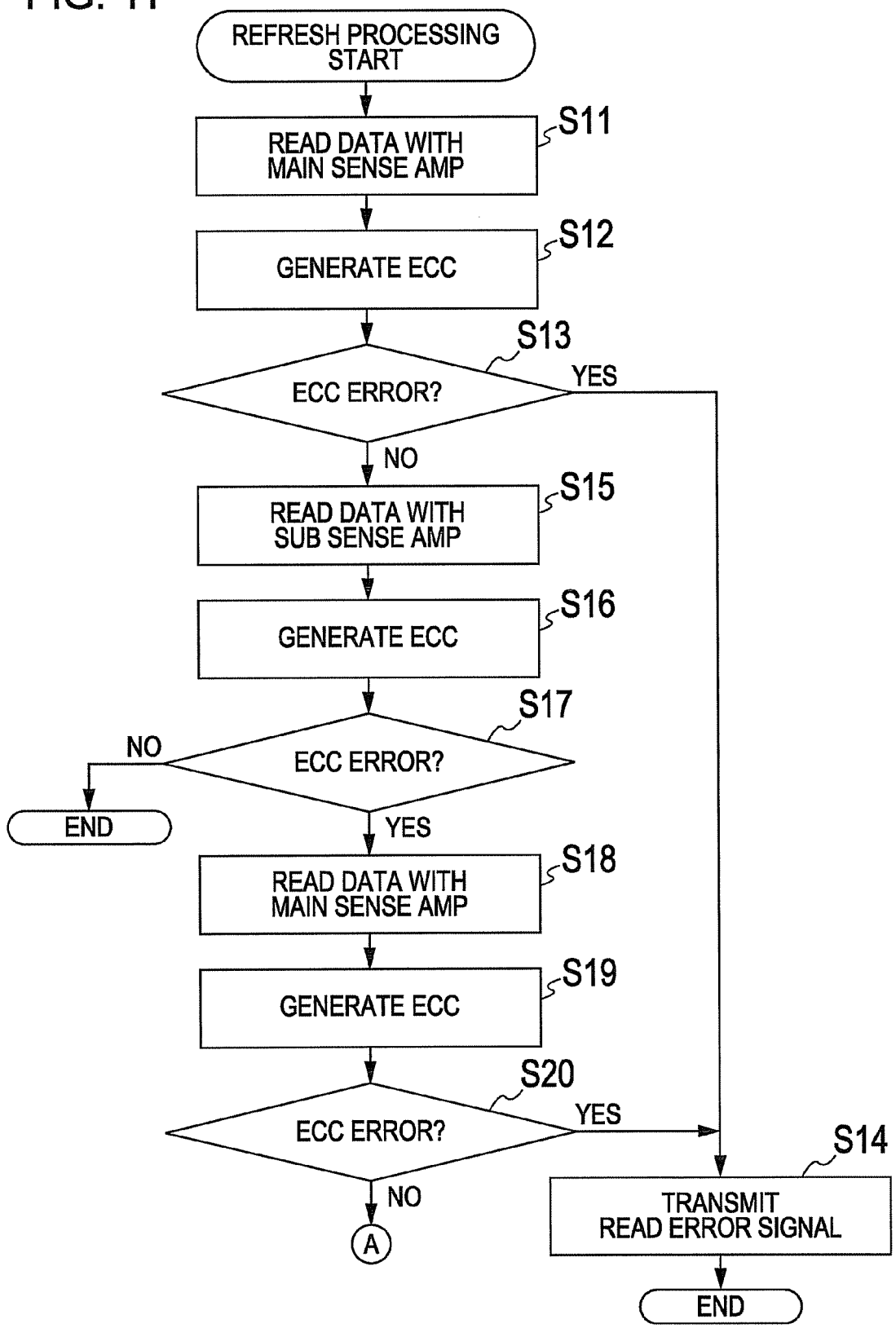
FIG. 11 is a flowchart illustrating refresh processing.
Figure 12:
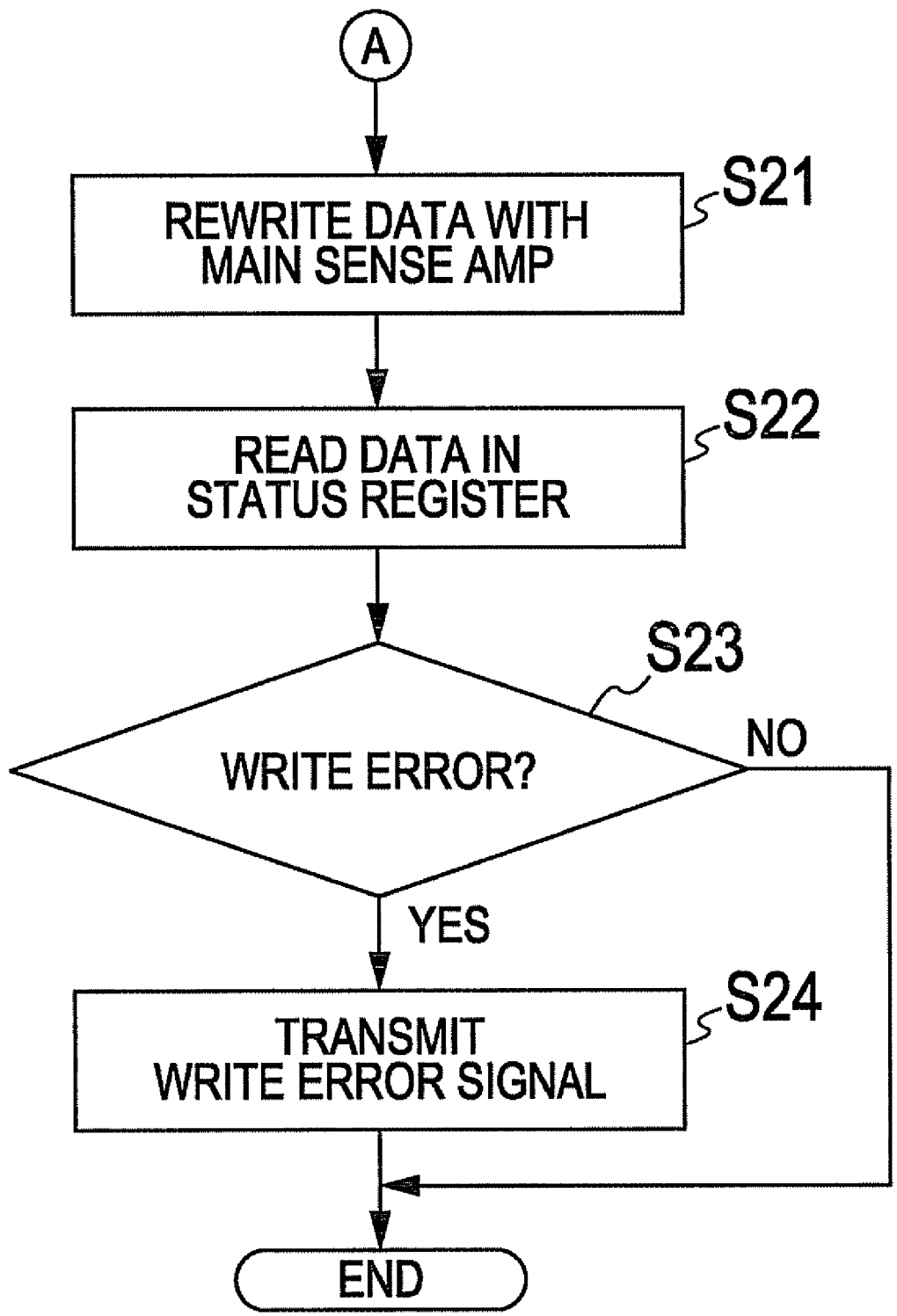
FIG. 12 is a flowchart illustrating refresh processing.

FIGS. 11 and 12 are flowcharts of refresh processing. First, data of the NAND flash array 225 (for example, data of the data structure illustrated in FIG. 7 or 8) is read with the main sense amplifier 2283 (step S11).

Subsequently, an ECC is generated from read data (step S12). Next, it is determined whether an ECC error occurs (step S13). If any ECC error occurs (Yes in step S13), a read error signal is sent to the PCU 11 (step S14). At this point, the processing is terminated.

On the other hand, if no error occurs (No in step S13), data of the NAND flash array 225 is read using the sub sense amplifier 2284 (step S15).

Next, an ECC is generated from the read data (step S16). Subsequently, it is determined whether an ECC error occurs (step S17). If no ECC error occurs (No in step S17), (since it is determined that a voltage margin for the floating gate is secured enough), the processing is terminated.

If an ECC error occurs (Yes in step S17), (since it is determined that a margin is insufficient), data in the NAND flash array 225 is read again using the main sense amplifier 2283 (step S18).

Then, an ECC is generated from the read data (step S19). Next, it is determined whether an ECC error occurs (step S20). If an ECC error occurs (Yes in step S20), the processing shifts to step S14, and a read error signal is sent to the CPU 11 (step S14). At this point, the processing is terminated.

If no ECC error occurs (No in step S20), data read with the main sense amplifier 2283 is written to a block at the target address of the NAND flash array 225 again (step S21).

Next, a value of "DWF" in the status register 30 of the NAND flash array 225 is read (step S22). Then, it is determined whether a write error occurs (step S23).

If no write error occurs (No in step S23), the processing is terminated. If a write error occurs (Yes in step S23), a write error signal is sent to the CPU 11 (step S24). At this point, the processing is terminated.

That is the end for the description about the refresh processing. In this embodiment, the processing in step S3 follows the processing in step S2. However, the processing in step S2 follows the processing in step S3.

Figure 13:
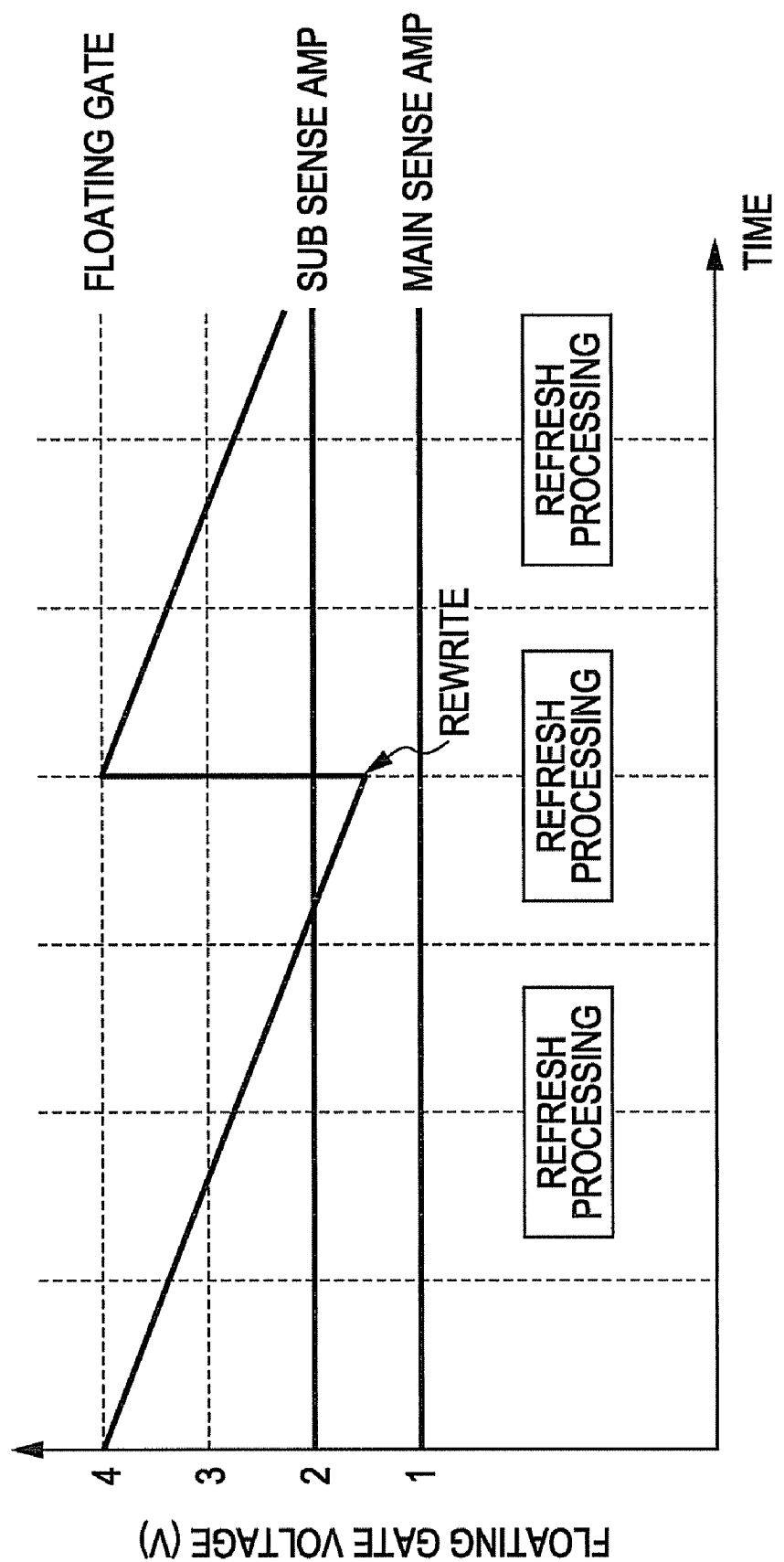
FIG. 13 illustrates effects of refresh processing.

FIG. 13 illustrates an effect of the refresh processing. The horizontal axis in a graph in FIG. 13 represents an elapsed time or the number of read/write cycles, and the vertical axis represents a voltage value of the floating gate.

In FIG. 13, "refresh processing" represents a timing of determination as to whether to rewrite data. If a voltage level of the floating gate is 2 V or more, a sufficient margin is secured, and data is not rewritten.

On the other hand, if a voltage level of the floating gate is 2 V or less, a margin is insufficient. Thus, data is held through the rewrite operation. In this way, if a voltage value of the floating gate is between the voltage of 1 V applied by the main reference cell 2281 and the voltage of 2V applied by the sub reference cell 2282, refresh processing is performed to rewrite data, making it possible to rewrite data when a voltage margin of the floating gate is secured enough.

Here, a voltage value of the sub reference cell 2282 is preferably set closer to a voltage value of the main reference cell 2281 than a value of write voltage although not particularly limited. If the voltage value is set in this way, the number of rewrite operations may be reduced, and the life of the nonvolatile memory 22 may be elongated.

As described above, according to the module 10, even if data storage performance of the NAND flash array 225 is lowered due to deterioration of an insulating film, data may be kept by rewriting data through refresh processing.

Further, at the first byte of the sector A, such byte as keeps a write state all the time is set and used for measuring a margin. As a result, a margin may be measured with high accuracy. Thus, a reliability of data may be enhanced.

Needless to say, the structure of this embodiment may be easily applied to any nonvolatile memory equipped with plural sense amplifiers. Here, information representing that refresh processing is being executed may be displayed on the display 15.

Figure 14:
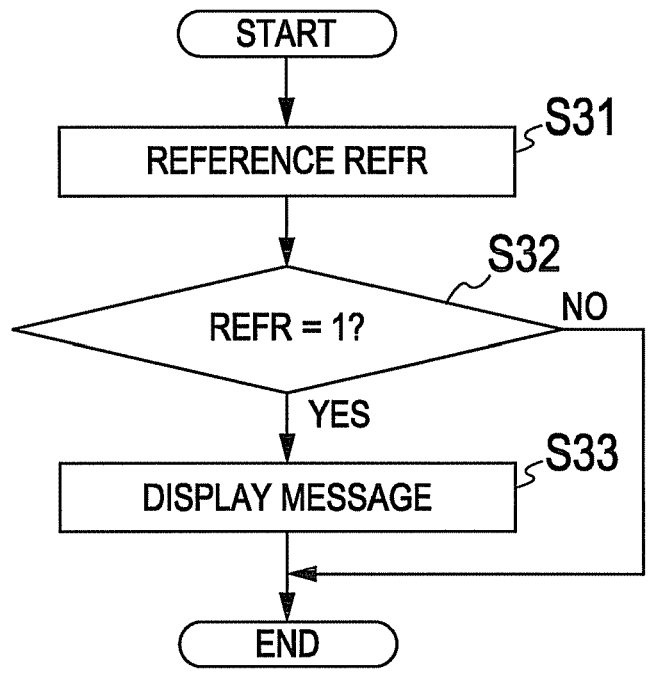
FIG. 14 is a flowchart of processing for displaying information representing that refresh processing is being executed on a display.

FIG. 14 is a flowchart of processing for displaying information representing that refresh processing is being executed on a display. The CPU 11 references "REFR" of the status register 30 of the NAND controller 21 (step S31).

Then, it is determined whether "1" is set in "REFR" (step S32). If "0" is set in "REFR" (no in step S32), the processing is terminated. On the other hand, "1" is set in "REFR" (Yes in step S32), it is determined that refresh processing is being executed. Thus, the notification is sent to the CPU 11. The CPU 11 displays a message that refresh processing is being performed on the display 15 (step S33). At this point, the processing is terminated.

With this message, a user may easily determine whether refresh processing is being executed. Further, a screen for prompting a user to replace the nonvolatile memory 22 may be displayed on the display 15.

Figure 15:
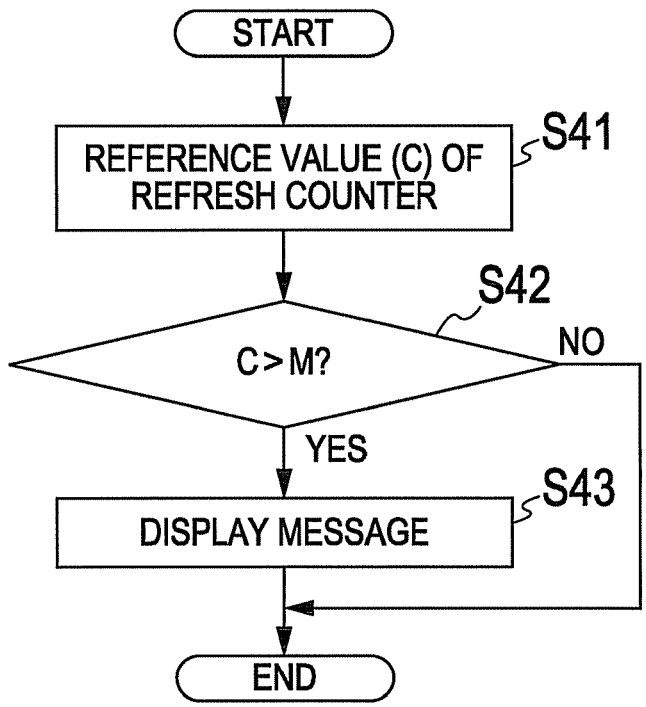
FIG. 15 is a flowchart of processing performed at the time of displaying a screen for prompting a user to replace a nonvolatile memory.

FIG. 15 is a flowchart of processing performed at the time of displaying a screen for prompting a user to replace the nonvolatile memory. The CPU 11 references a value "C" of a refresh counter of the nonvolatile memory 22 (step S41).

Then, the value "C" of the refresh counter is compared with a preset value "M" (for example, M=100) to determine whether the value "C" is larger than the value "M" (step S42). If the value "C" is smaller than the value "M" (No in step S42), the processing is terminated.

On the other hand, if the value "C" is larger than the value "M" (Yes in step S42), it is determined that the nonvolatile memory 22 needs to be replaced, and the notification is sent to the CPU 11. The CPU 11 displays a message that the nonvolatile memory 22 needs to be replaced on the display 15 (step S43). At this point, the processing is terminated.

With this message, a user may easily know the time for replacement of the nonvolatile memory 22. Next, a system according to a second embodiment is described.

The following description is focused on a difference between the system of the second embodiment and the foregoing first embodiment, and similar components are not described. The system of the second embodiment is the same as the first embodiment except for the configuration of the sense amplifier circuit 228 of the first embodiment.

Figure 16:
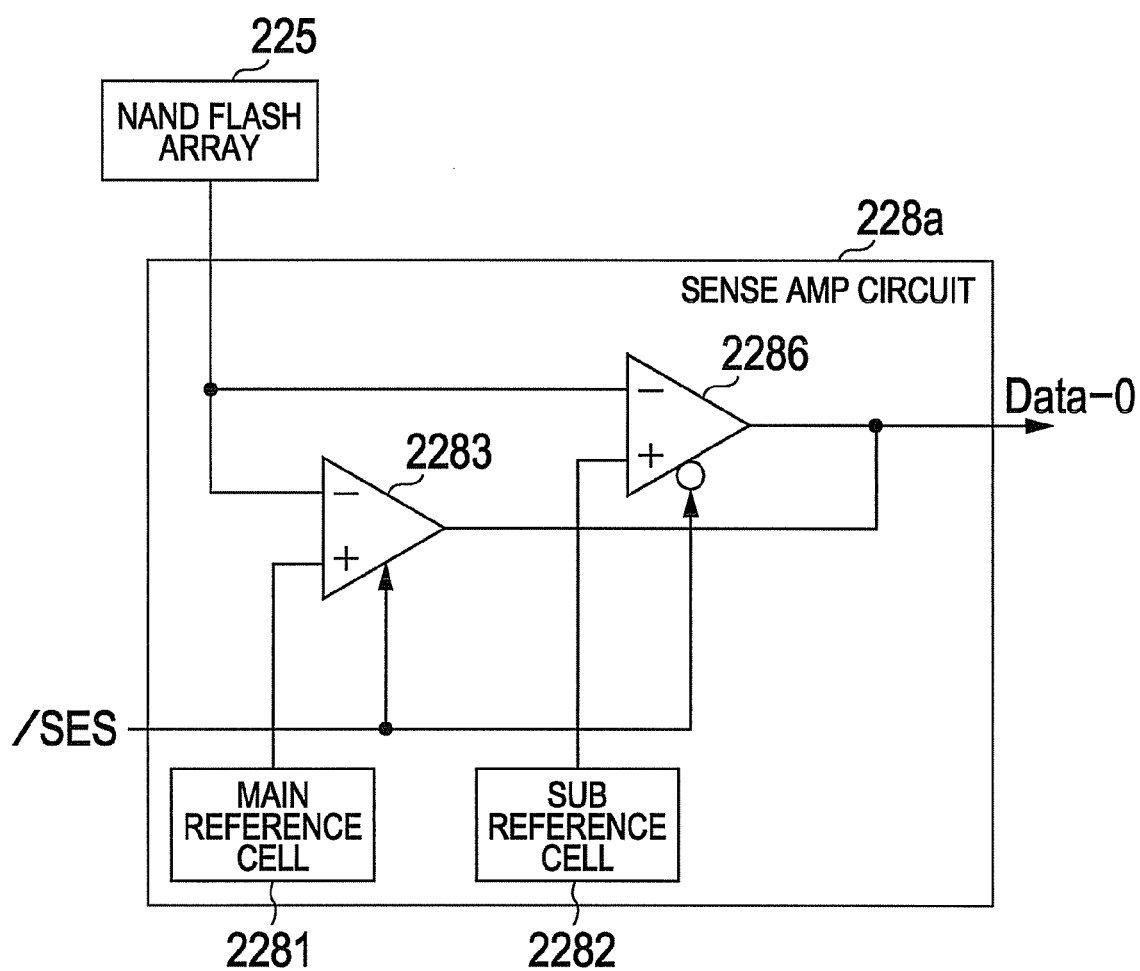
FIG. 16 is a block diagram illustrating the configuration of a sense amplifier circuit according to a second embodiment.

FIG. 16 is a block diagram illustrating the configuration of the sense amplifier circuit of the second embodiment. A sense amplifier circuit 228a is not provided with the logic circuit 2285. Instead, the "/SES" signal for specifying a sense amplifier for outputting the signal Data-0 is directly input to the main sense amplifier 2283 and the sub sense amplifier 2286.

Further, the sub sense amplifier 2286 is provided with an inversion input terminal to which the "/SES" signal is input with the logic being inverted. Thus, a signal having the logic of "1" is input to one amplifier, and a signal having the logic of "0" is input to the other amplifier. As a result, the signal of the selected one of the sense amplifiers is output as Data-0.

According to the system of the second embodiment, the same effect as the system of the first embodiment is obtained. Next, a system according to a third embodiment is described.

The following description is focused on a difference between the system of the third embodiment and the foregoing first embodiment, and similar components are not described. The system of the second embodiment is the same as the first embodiment except for the configuration of a nonvolatile memory.

Figure 17:
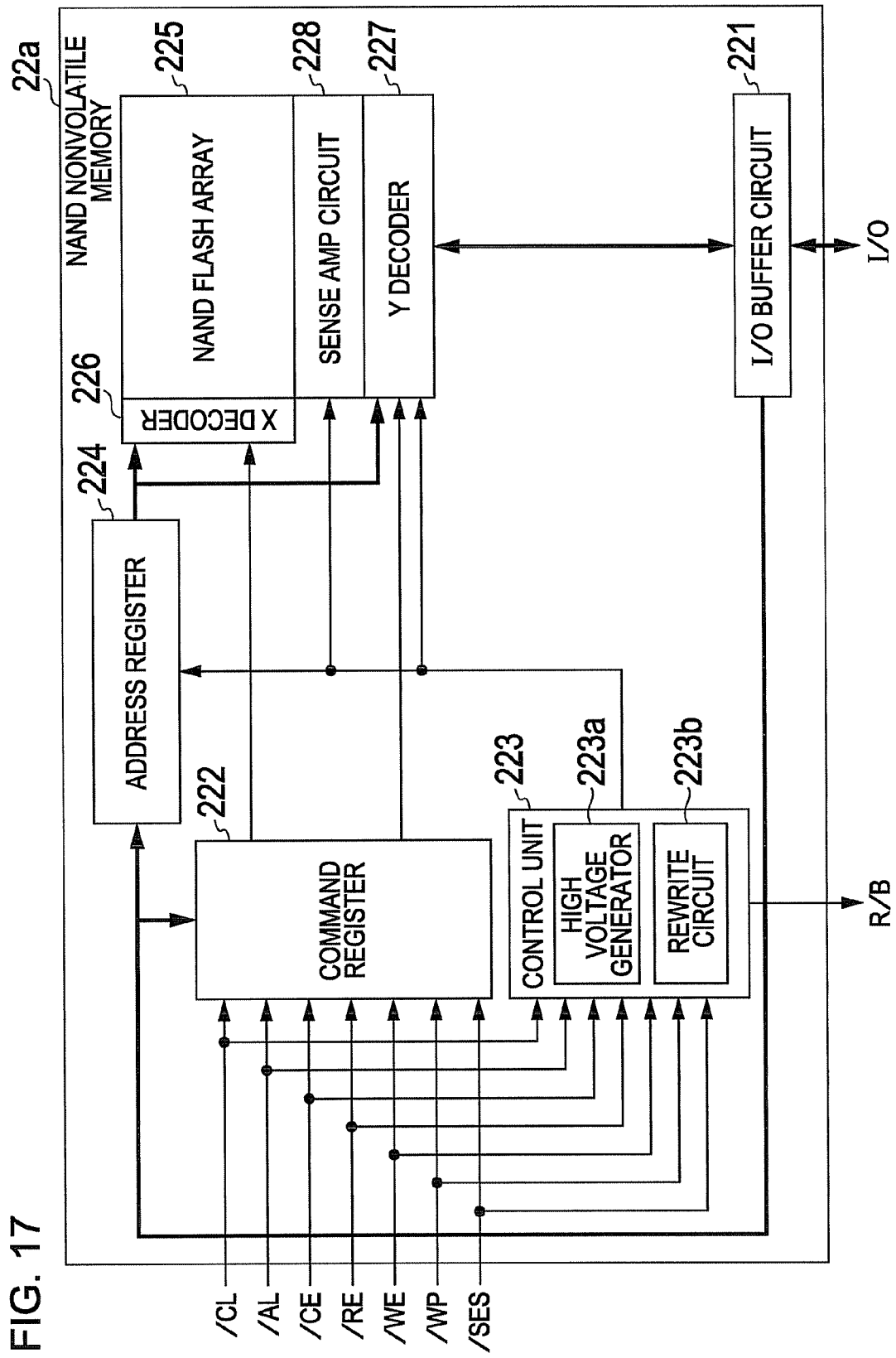
FIG. 17 is a block diagram illustrating a nonvolatile memory according to a third embodiment.

FIG. 17 is a block diagram illustrating a nonvolatile memory of the third embodiment. The control unit 223 of a nonvolatile memory 22a of the third embodiment reads data of a block at an externally designated address (hereinafter referred to as "rewrite address") and stores the data in the I/O buffer circuit 221. The control unit 223 includes a rewrite circuit (Rewrite Circuit) 223b for rewriting data stored in the I/O buffer circuit 221 in the block at the address after erasing the data of the bock at the address.

FIG. 18 illustrates a command function of the nonvolatile memory of the third embodiment. In a command function table 40a, a command (rewrite command) for rewriting data to a block at a rewrite address (Rewrite to Current block) is added.

An operation of rewriting data to the block at the rewrite address is performed by sending a command code "50h" at the first cycle and sending a command code "10h" at the second cycle.

Figure 19:
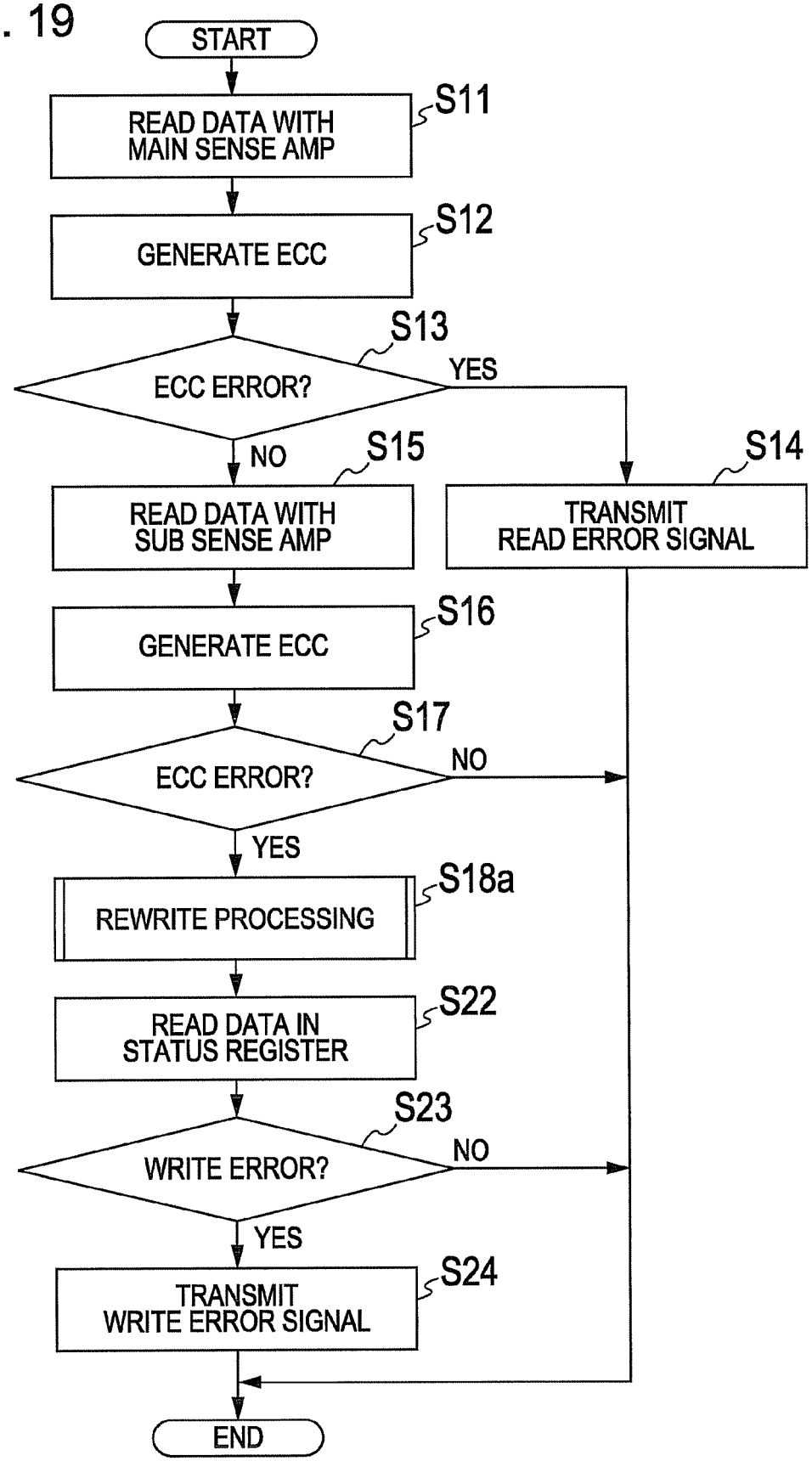
FIG. 19 is a flowchart of the refresh processing of the third embodiment.

Next, refresh processing of the third embodiment is described. FIG. 19 is a flowchart of the refresh processing of the third embodiment. The following description is focused on a difference from the refresh processing of the first embodiment.

If an ECC error occurs (Yes in step S17), (since it is determined that a margin is insufficient), a rewrite command is sent to the nonvolatile memory 22. As a result, the rewrite circuit 223b of the nonvolatile memory 22 performs the rewrite processing (step S18a).

Figure 20:
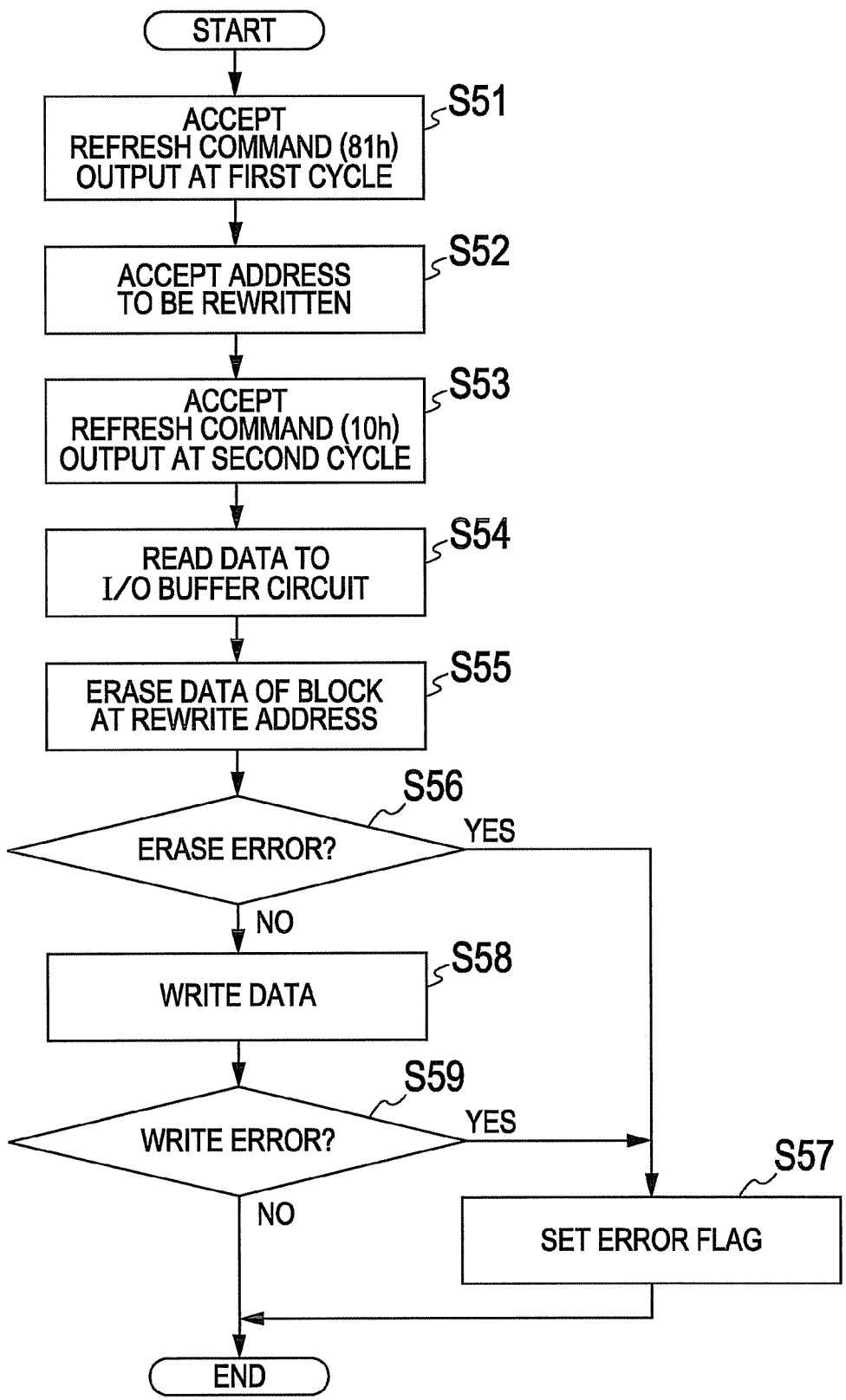
FIG. 20 is a flowchart of the rewrite processing.

After that, the processing shifts to step S22, and step S22 and subsequent steps are performed. Next, rewrite processing in step S18a is described. FIG. 20 is a flowchart of the rewrite processing.

First, the command register 222 accepts a refresh command (81h) issued at the first cycle from the NAND controller 21 (step S51). Next, the address register 224 accepts a rewrite address from the NAND controller 21 (step S52).

Next, the command register 222 accepts a refresh command (10h) issued at the first cycle from the NAND controller 21 (step S53). Next, data is read to the I/O buffer circuit 221 from the NAND flash array 225 (step S54).

Subsequently, data of a block at the address is erased while the data is held in the I/O buffer circuit 221 (step S55). Next, it is determined whether an erase error occurs (step S56).

If the erase error occurs (Yes in step S56), a flag indicating the occurrence of the error is set in "DWF" of the status register 30 (step S57). At this point, the processing is terminated.

On the other hand, if no erase error occurs (No in step S56), data stored in the I/O buffer circuit 221 is written to a block at the rewrite address (step S58).

Next, it is determined whether a write error occurs (step S59). If a write error occurs (Yes in step S59), the processing shifts to step S57, and step S57 and subsequent steps are performed.

If no write error occurs (No in step S59), the processing is terminated. In this embodiment, the processing in step S53 follows the processing in step S52. However, the processing in step S52 follows the processing in step S53.

According to the system of the third embodiment, the same effect as the system of the first embodiment is obtained. Next, a system according to a fourth embodiment is described.

The following description is focused on a difference between the system of the fourth embodiment and the foregoing third embodiment, and similar components are not described. The system of the fourth embodiment is the same as the third embodiment except for the configuration of the nonvolatile memory.

Figure 21:
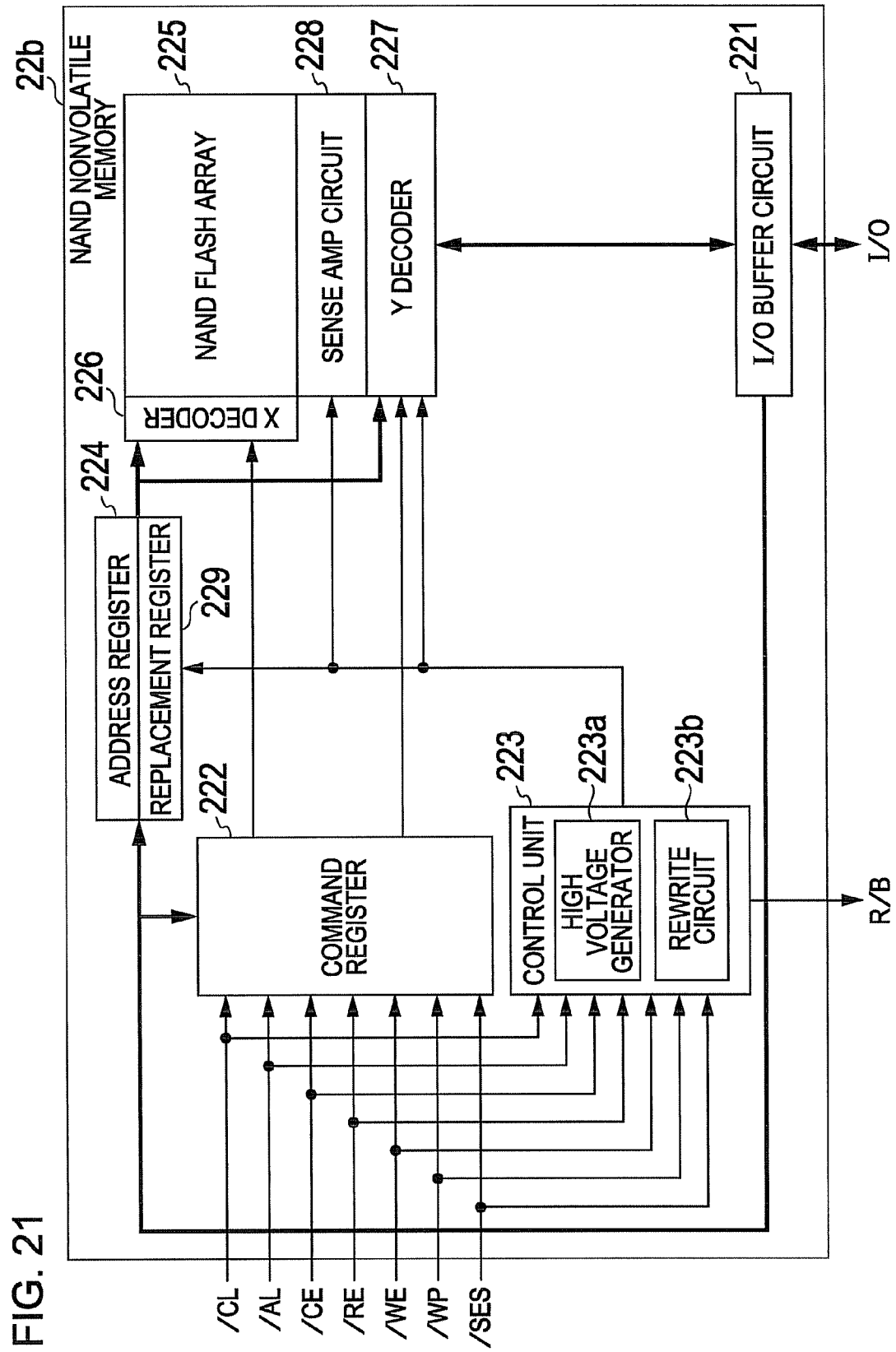
FIG. 21 is a block diagram of a nonvolatile memory according to a fourth embodiment.

FIG. 21 is a block diagram of a nonvolatile memory of the fourth embodiment. The nonvolatile memory 22*b* reads data of a block at a rewrite address and stores the data in the I/O buffer circuit 221. The nonvolatile memory 22*b* includes a replace register (Replace Register) 229 for rewriting data of a block at an address (hereinafter referred to as "replacement address") different from the externally designated address independently of the I/O buffer circuit 221.

FIG. 22 illustrates a command function of the nonvolatile memory of the fourth embodiment. In a command function table 40*b*, a command to rewrite data to a block at the replacement address (Rewrite to Replacement Block) (replace command) is added.

An operation of rewriting data to the block at the replacement address is performed by sending a command code "83h" at the first cycle and sending a command code "10h" at the second cycle.

Next, refresh processing of the fourth embodiment is described. The refresh processing of the fourth embodiment differs from the third embodiment in step S18*a* in FIG. 19.

Figure 23:
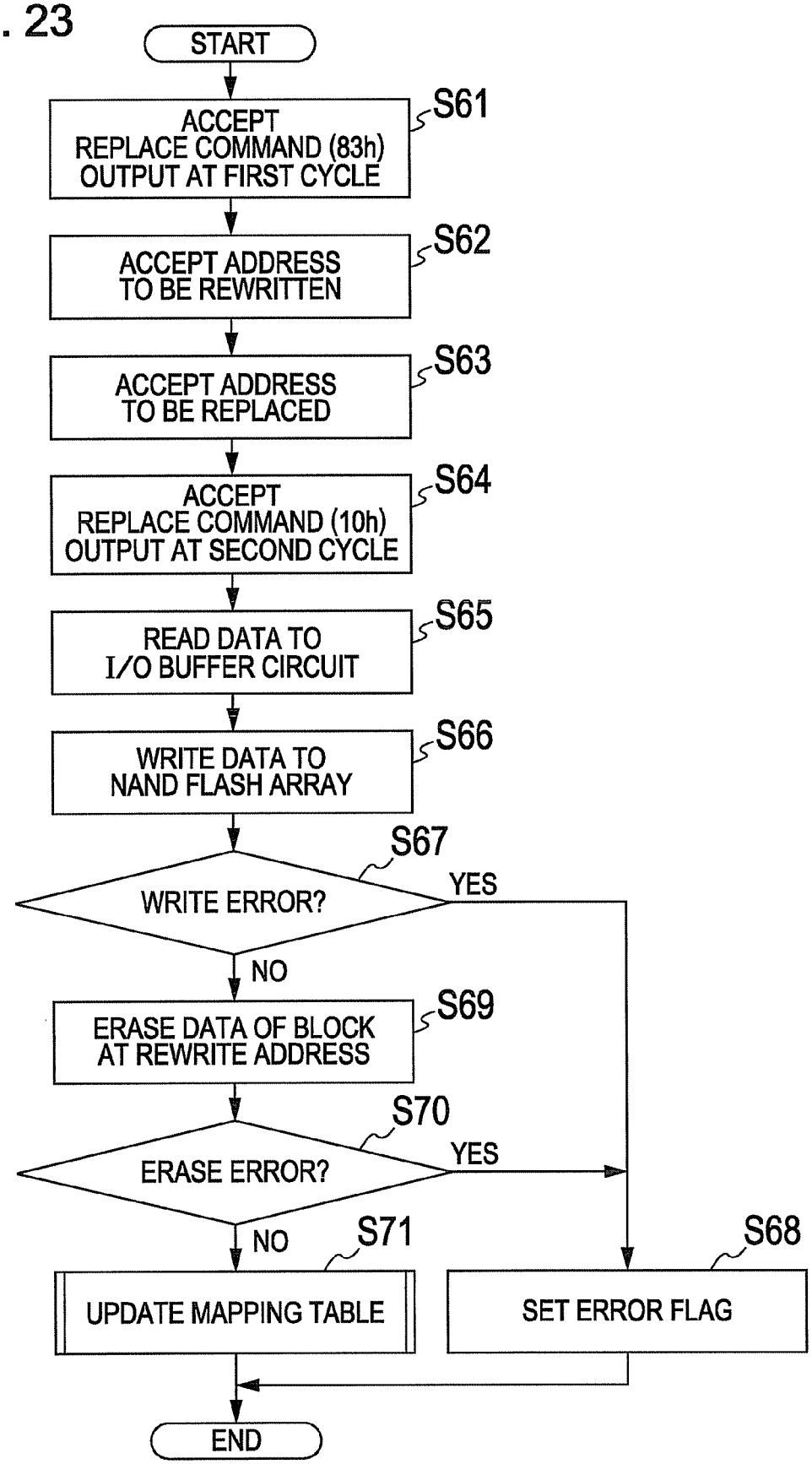
FIG. 23 is a flowchart illustrating the rewrite processing of the fourth embodiment.

The rewrite processing of the fourth embodiment is described below. FIG. 23 is a flowchart illustrating the rewrite processing of the fourth embodiment. First, the command register 222 accepts a replace command (83*h*) issued at the first cycle from the NAND controller 21 (step S61).

Next, the address register 224 accepts a rewrite address from the NAND controller 21 (step S62). Next, the replace register 229 accepts a replacement address from the NAND controller 21 (step S63).

Subsequently, the command register 222 accepts a replace command (10*h*) issued at the second cycle from the NAND controller 21 (step S64). Next, data is read to the I/O buffer circuit 221 from the block at the designated rewrite address in the NAND flash array 225 and stores the data in the I/O buffer circuit 221 (step S65).

Next, the control unit 223 switches the address to the replacement address and writes the data stored in the I/O buffer circuit 221 to the block at the replacement address (step S66).

Next, it is determined whether a write error occurs (step S67). If a write error occurs (Yes in step S67), a flag indicating the occurrence of the error is set in "DWF" of the status register 30 (step S68). After that, the processing is terminated.

On the other hand, if no write error occurs (No in step S67), data in the block at the rewrite address is erased (step S69). Next, it is determined whether an erase error occurs (step S70).

If the erase error occurs (Yes in step S70), the processing shifts to step S68, and step S68 and subsequent steps have been performed. On the other hand, if no erase error occurs (No in step S70), a mapping table describing a relationship between a logical address and a physical address is updated in accordance with an instruction from the NAND controller 21 (step S71). At this point, the processing is terminated.

Figure 24:
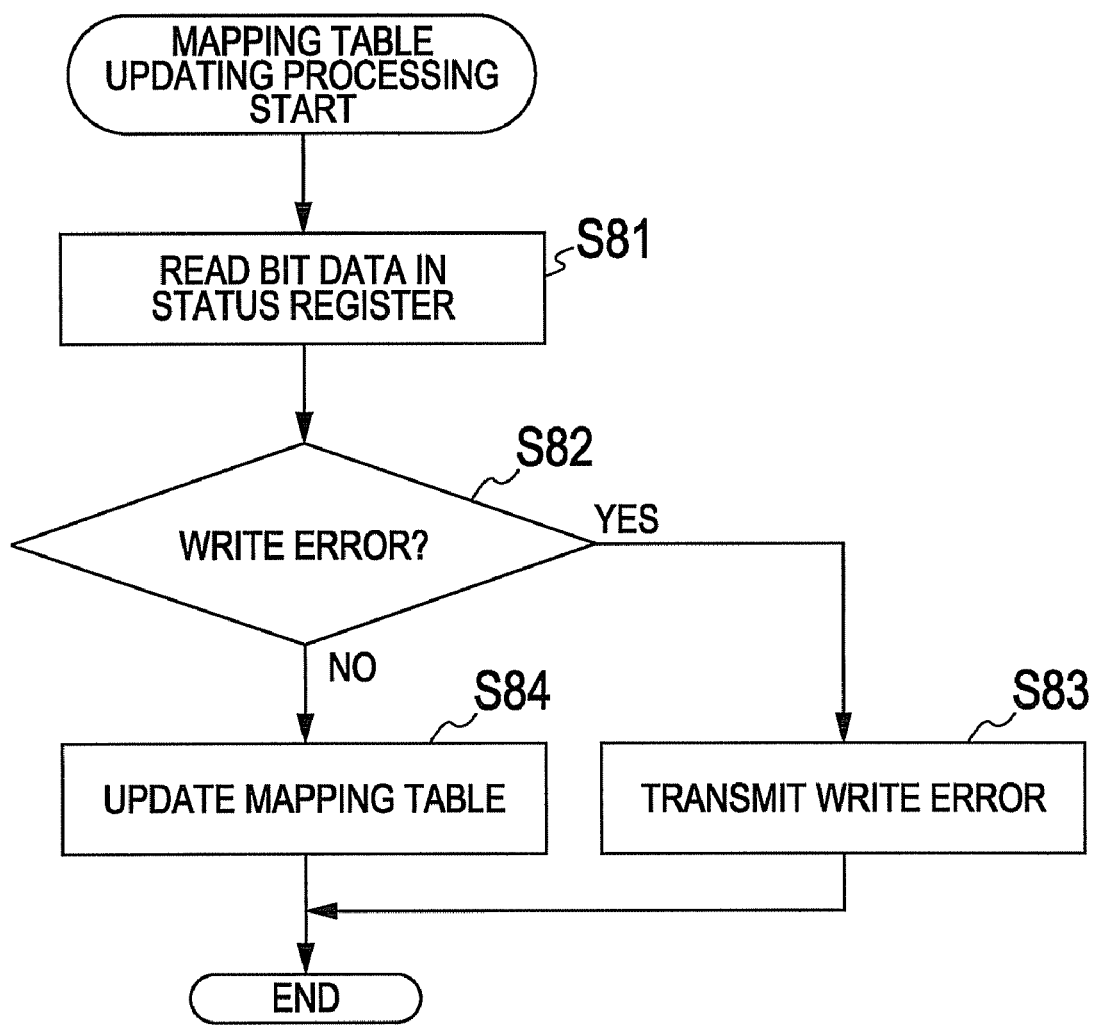
FIG. 24 is a flowchart illustrating the processing for updating a mapping table.

The processing for updating the mapping table with the NAND controller 21 is described below. FIG. 24 is a flowchart illustrating the processing for updating the mapping table.

First, a replace command is sent to the nonvolatile memory 22 to read bit data of the first sense amplifier 30 (step S81). Next, it is determined whether a write error occurs (step S82).

If a write error occurs (Yes in step S82), the write error is sent to the CPU 11 (step S83). At this point, the processing is terminated. If no write error occurs (No in step S82), the mapping table is updated (step S84). To be specific, the physical address corresponding to the logical address is replaced to the replace address from the address at which the data was read. At this point, the processing is terminated.

According to the system of the fourth embodiment, the same effects as the system of the third embodiment are obtained. Moreover, since the nonvolatile memory 22 rapidly degrades if data is written to and erased from the block at the same address, it is preferred to uniformly perform rewrite to all addresses.

According to the system of the fourth embodiment, the number of rewrite operations may be averaged by rewriting data to a block at an address different from the address from which data was read. As a result, the life of the nonvolatile memory 22 is elongated, and a reliability of data may be further enhanced.

Next, a system according to a fifth embodiment is described. The following description is focused on a difference between the system of the fifth embodiment and the foregoing first embodiment, and similar components are not described.

Figure 25:
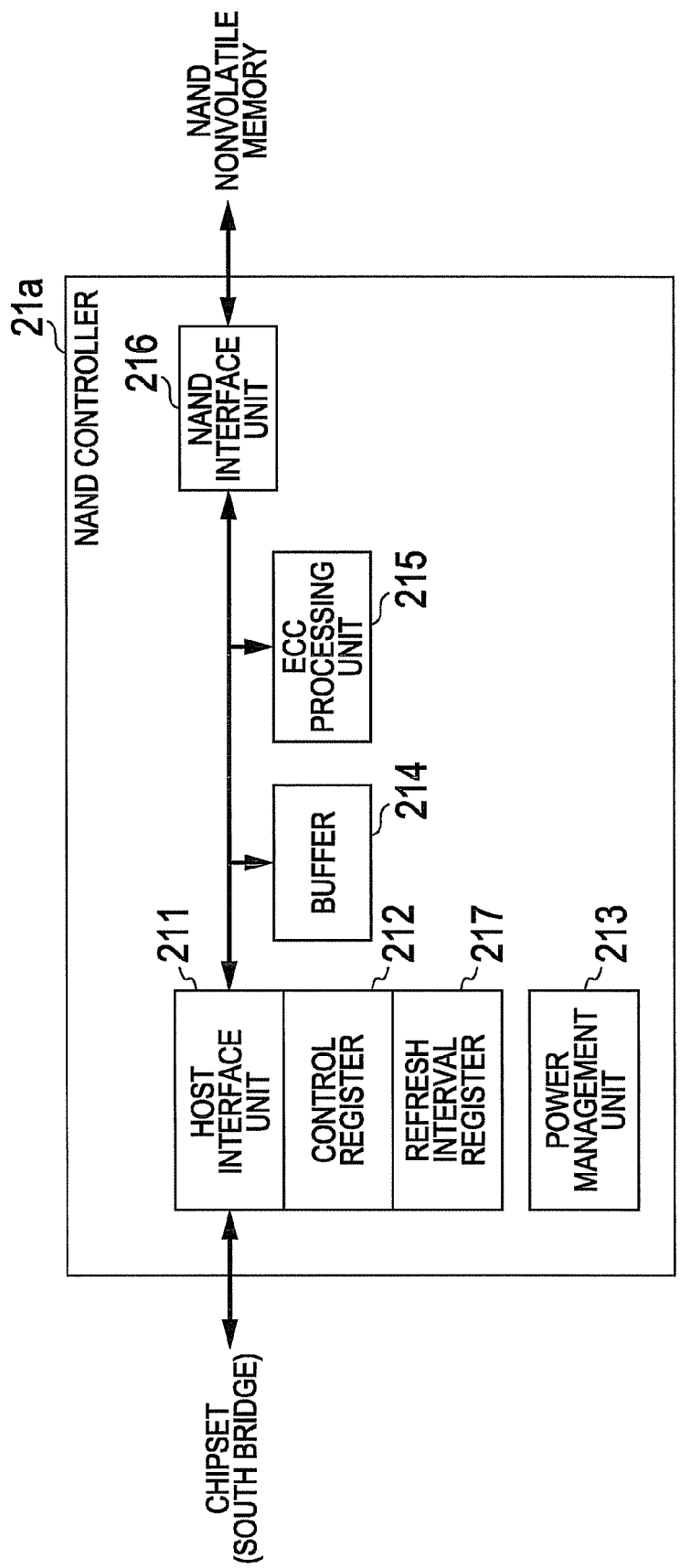
FIG. 25 is a block diagram illustrating the configuration of a NAND controller according to a fifth embodiment.

The system of the fifth embodiment is the same as the first embodiment except for the configuration of a NAND controller. FIG. 25 is a block diagram illustrating the configuration of a NAND controller of the fifth embodiment.

A NAND controller 21*a* includes a refresh interval register (Refresh Interval Register) 217 with a threshold value for determining whether a target value exceeds a predetermined number of times, which may be set by the CPU 11.

Further, the NAND controller 21*a* writes the number of times data is read from, erased from, or written to a predetermined position (as described below) of a nonvolatile memory as information about the number of accesses.

Then, the NAND controller 21*a* performs refresh processing if the information about the number of accesses read from the nonvolatile memory 22 exceeds a numerical value set in a refresh interval register 217.

Figure 26:
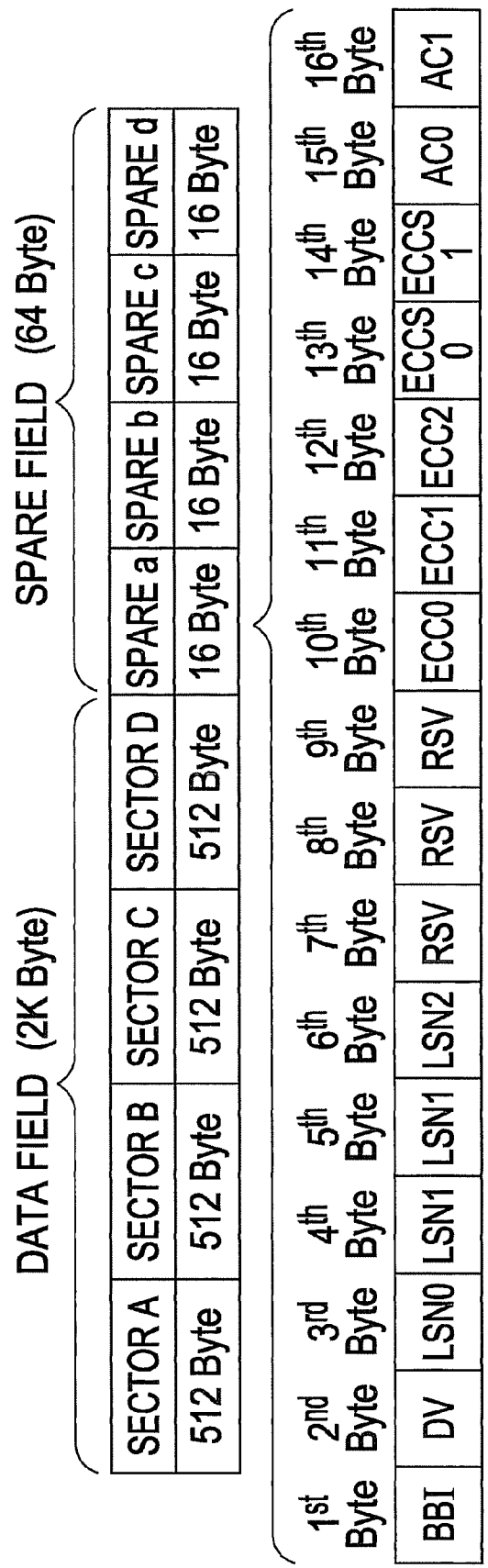
FIG. 26 illustrates an example of information about the preset number of accesses.

FIG. 26 illustrates an example of information about the preset number of accesses. An access counter (AC: Access counter) to which the number of accesses is to be written is set in the 15th byte and 16th byte of the spares a, b, c, and d. In FIG. 21, a preset example of the spare a is illustrated by way of example.

Figure 27:
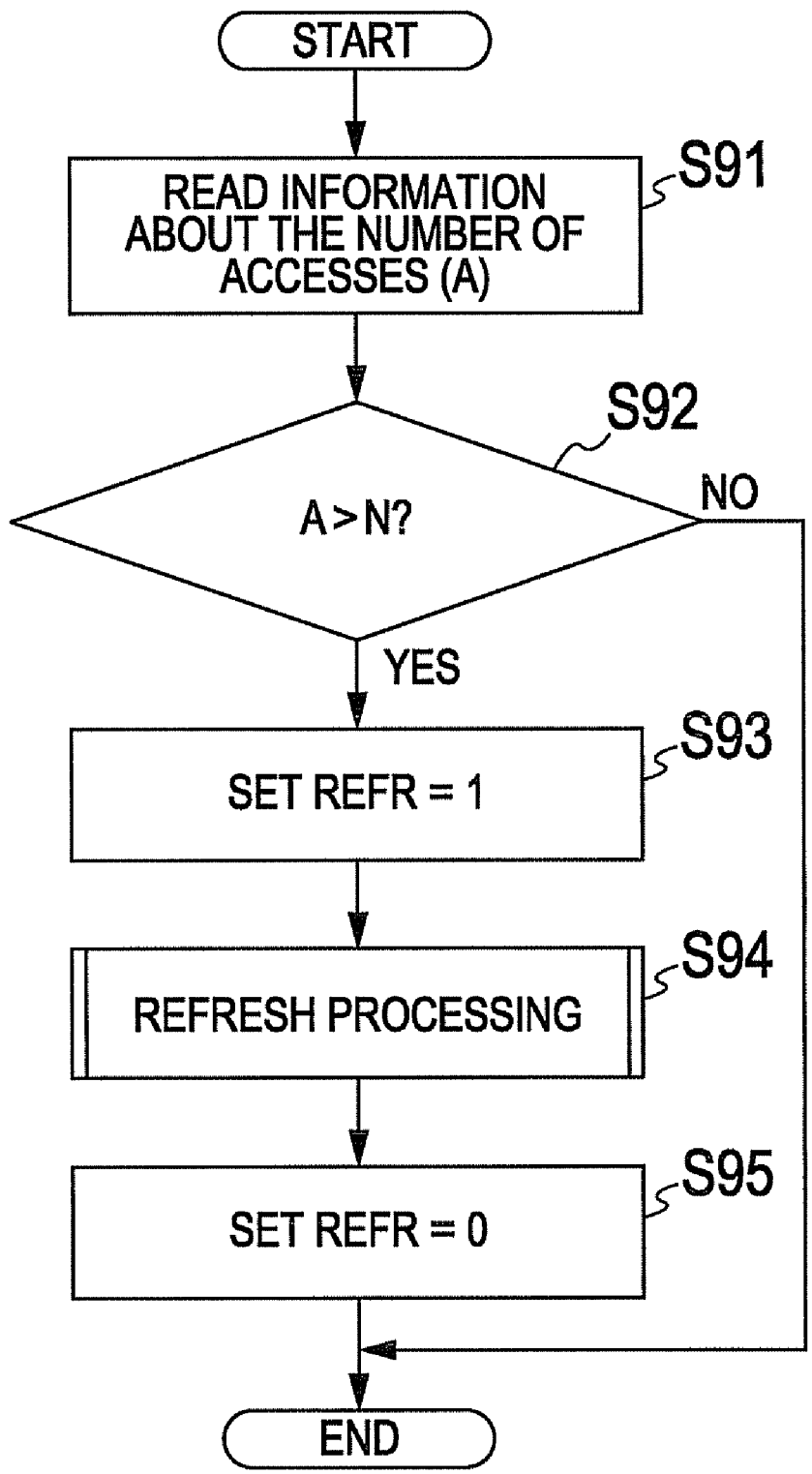
FIG. 27 is a flowchart of the processing for determining whether to execute refresh processing of the fifth embodiment.

Next, processing for determining whether to execute refresh processing of the fifth embodiment is described. FIG. 27 is a flowchart of the processing for determining whether to execute refresh processing of the fifth embodiment.

First, an access counter of the NAND flash array 225 is referenced, and the information about the number of accesses is read (step S91). Next, a value "A" indicating the number of accesses and a preset value "N" (for example, N=1000) are compared to determine whether the value "A" indicating the number of accesses is larger than the value "N" (step S92).

If the value "A" is smaller than the value "N" (No in step S92), the processing is terminated. On the other hand, if the value "A" is larger than the value "N" (Yes in step S92), "1" is set to "REFR" of the status register 30 (step S93).

Next, the refresh processing is performed (step S94). This refresh processing is similar to that illustrated in FIG. 11. After the completion of the refresh processing, "0" is set to "REFR" of the status register 30 (step S95).

At this point, the processing is terminated. That is the end for the description about the processing for determining whether to execute refresh processing. According to the system of the fifth embodiment, the same effects as the first embodiment may be obtained.

According to the system of the fifth embodiment, the refresh processing is performed based on the number of actual accesses. Thus, a reliability of data may be further enhanced. Next, a system according to a sixth embodiment is described.

The following description is focused on a difference between the system of the sixth embodiment and the foregoing fifth embodiment, and similar components are not described. The system of the sixth embodiment is the same as the fifth embodiment except for the function of the CPU 11.

The CPU 11 of the sixth embodiment reads a counter value of a refresh counter from the nonvolatile memory 22. If the read value is larger than a predetermined value, the CPU changes a value of the refresh interval register 217 in the NAND controller 21a.

Figure 28:
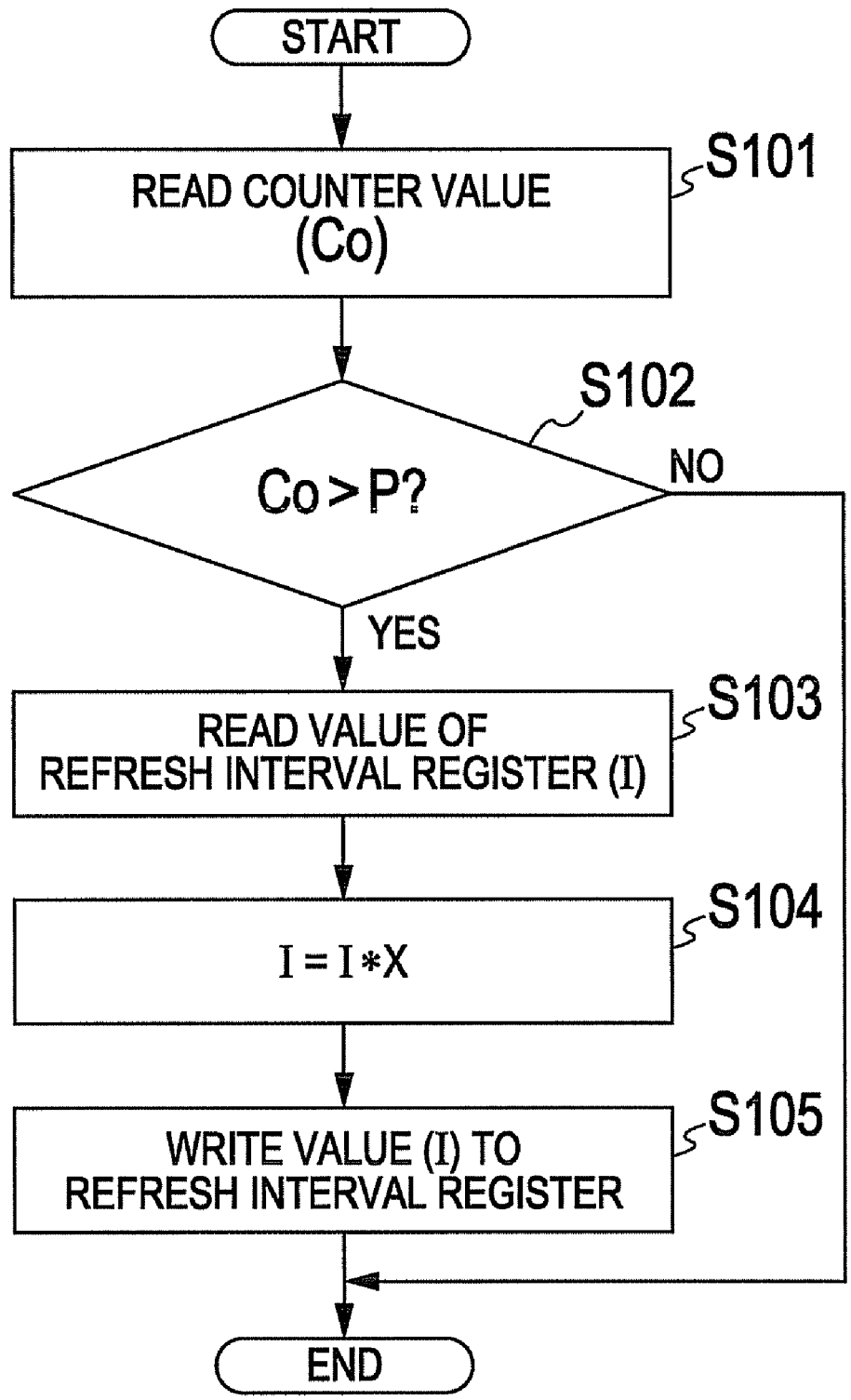
FIG. 28 is a flowchart illustrating the refresh interval change processing.

FIG. 28 is a flowchart illustrating the refresh interval change processing. First, the refresh counter of the NAND flash array 225 is referenced to read a counter value (step S101).

Next, a counter value "Co" of the refresh counter is compared with a preset value "P" (for example, P=10) to determine whether the counter value "Co" is larger than the value "P" (step S102).

If the counter value "Co" is smaller than the value "P" (No in step S102), the processing is terminated. On the other hand, if the counter value "Co" is larger than the value "P" (Yes in step S102), a value "I" of the refresh interval register 217 of the NAND controller 21 is read (step S103).

Next, the refresh interval is changed (step S104). To be specific, for example, "X=0.5" is set to thereby reduce by half the value "I". Next, the register value changed in step S104 is written to the refresh interval register 217 (step S1015). At this point, the processing is terminated.

Figure 29:
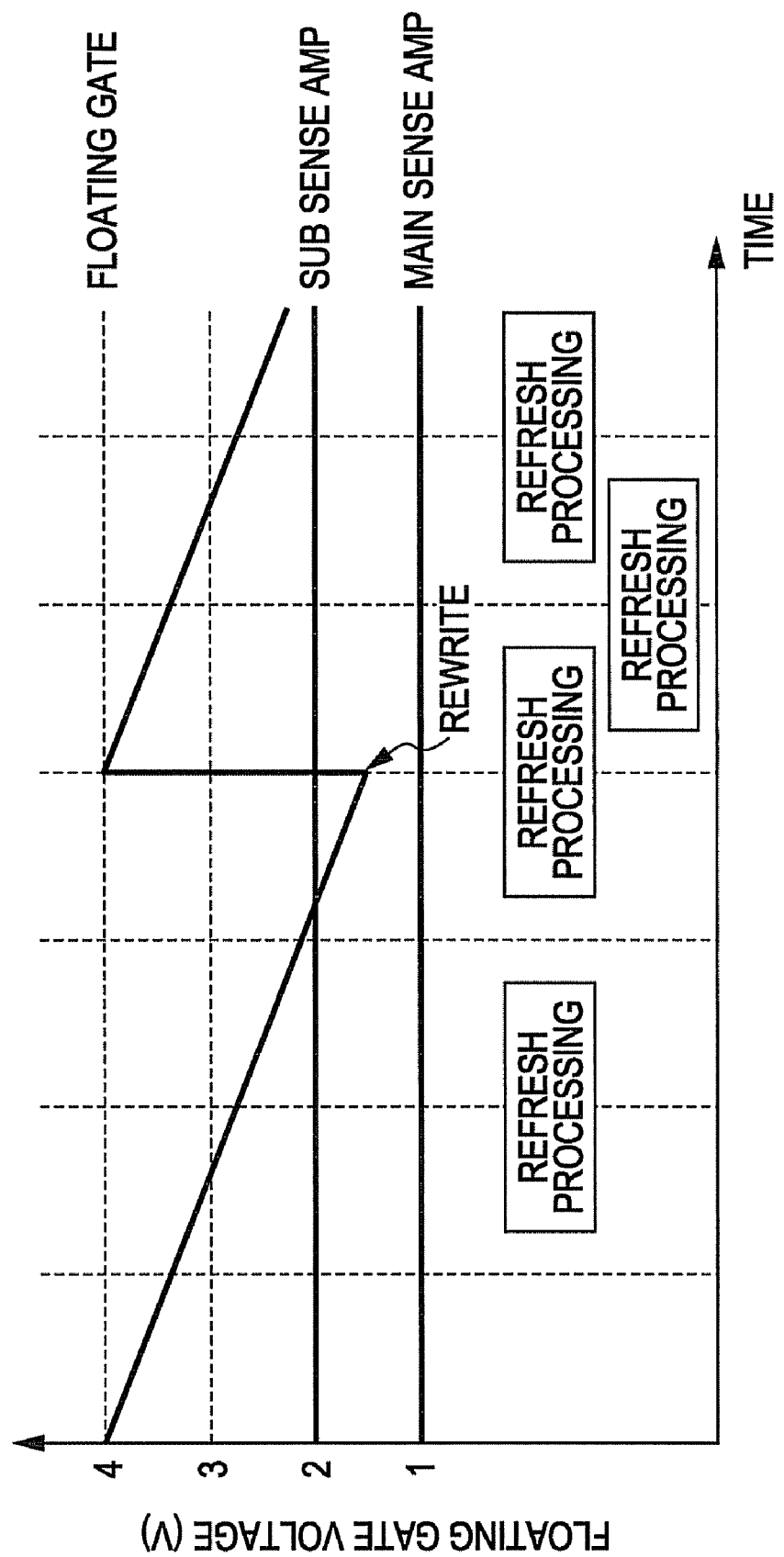
FIG. 29 illustrates effects of the refresh interval change processing.

FIG. 29 illustrates effects of the refresh interval change processing. As a result of the refresh interval change processing, a refresh processing interval set to two or three processings and three or four processings is reduced by half to one or two processings.

According to the system of the sixth embodiment, the same effects as the system of the fifth embodiment may be obtained. In addition, according to the system of the sixth embodiment, even if the number of write operations increases and a data storage period is reduced due to deterioration of an insulating film, a reliability of data may be further enhanced by reducing an interval of refresh processing.

Next, a system according to a seventh embodiment is described. The following description is focused on a difference between the system of the seventh embodiment and the foregoing first embodiment, and similar components are not described.

Figure 30:
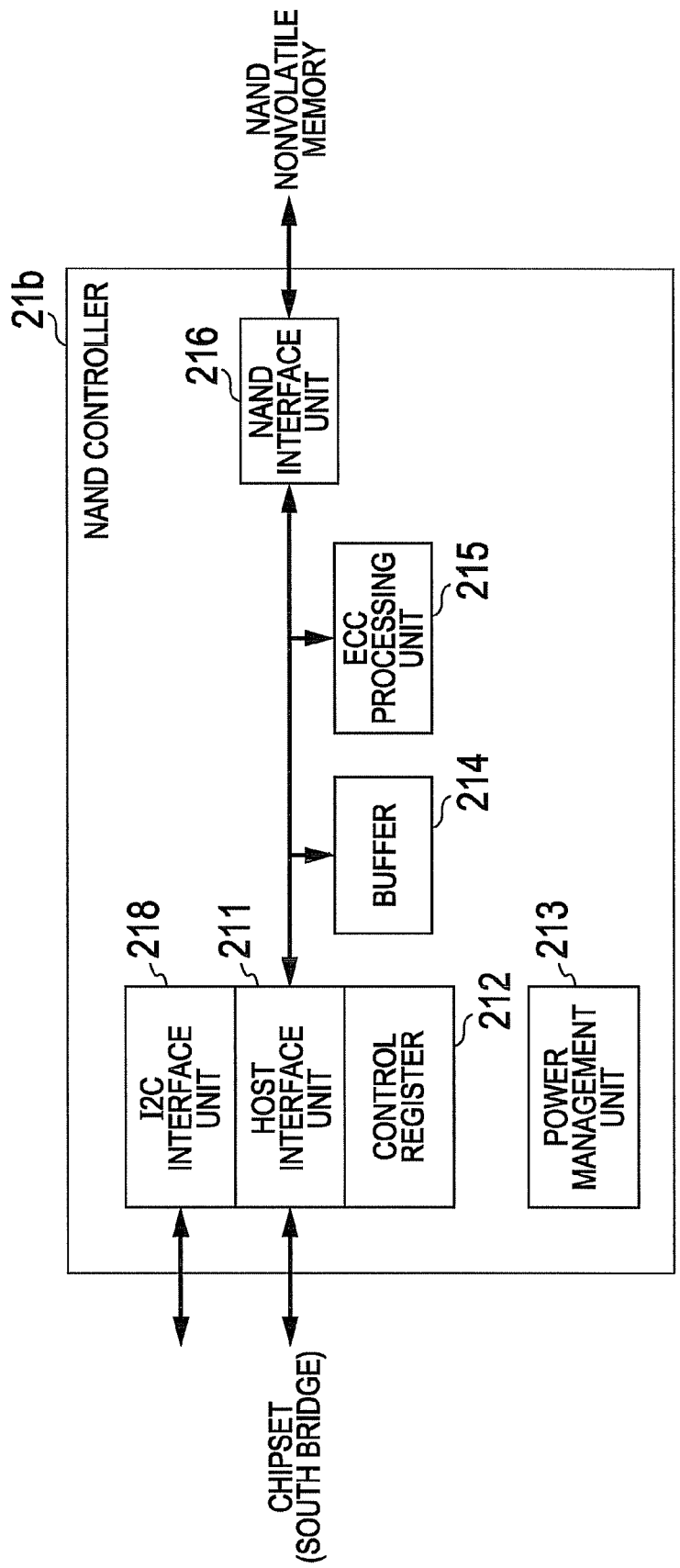
FIG. 30 is a block diagram illustrating the configuration of a NAND controller according to a seventh embodiment.

The system of the seventh embodiment is the same as the first embodiment except for the configuration of a NAND controller. FIG. 30 is a block diagram illustrating the configuration of a NAND controller of the seventh embodiment.

The NAND controller 21b further includes an I2C interface unit (I2C Interface Unit) 218 for obtaining current date and time information from a real time clock IC (not illustrated) in the module 10.

Figure 31:
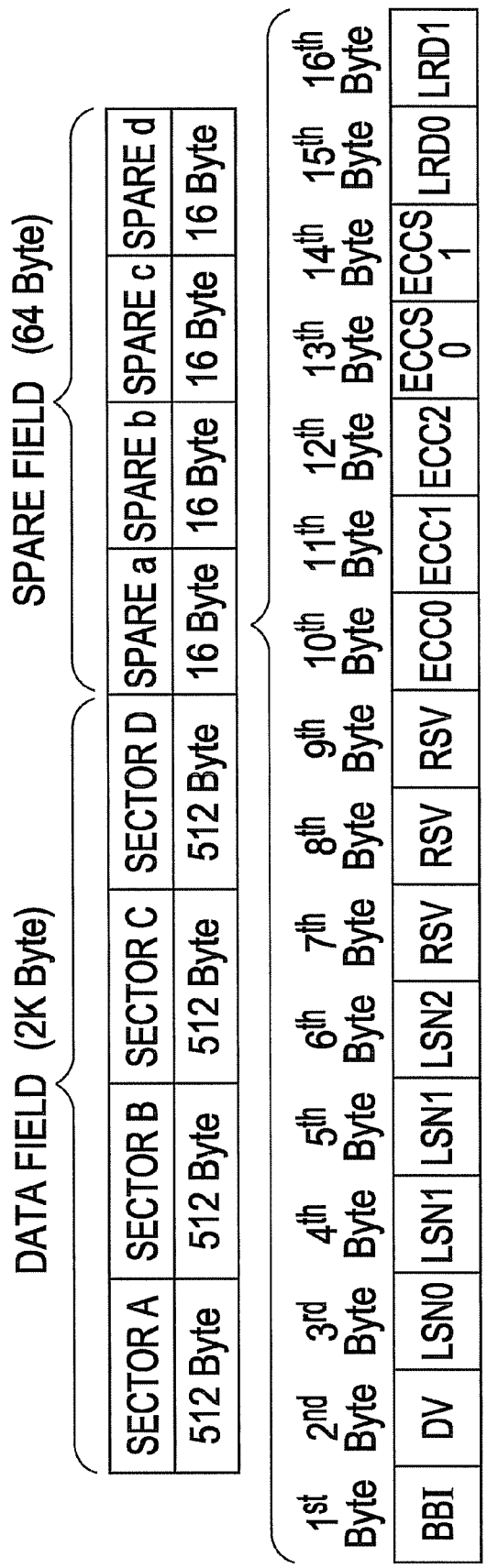
FIG. 31 illustrates current date and time information set in a nonvolatile memory.

The NAND interface unit 216 sets the current date and time information obtained with the I2C interface unit 218 in a predetermined area of the nonvolatile memory 22. FIG. 31 illustrates the current date and time information set in the nonvolatile memory.

An LRD (Latest Refresh Date) indicating the date and time of the last refresh processing is set in the 15th bit and 16th bit of the spares a, b, c, and d. In FIG. 31, the set example of the spare a is illustrated by way of example.

Figure 32:
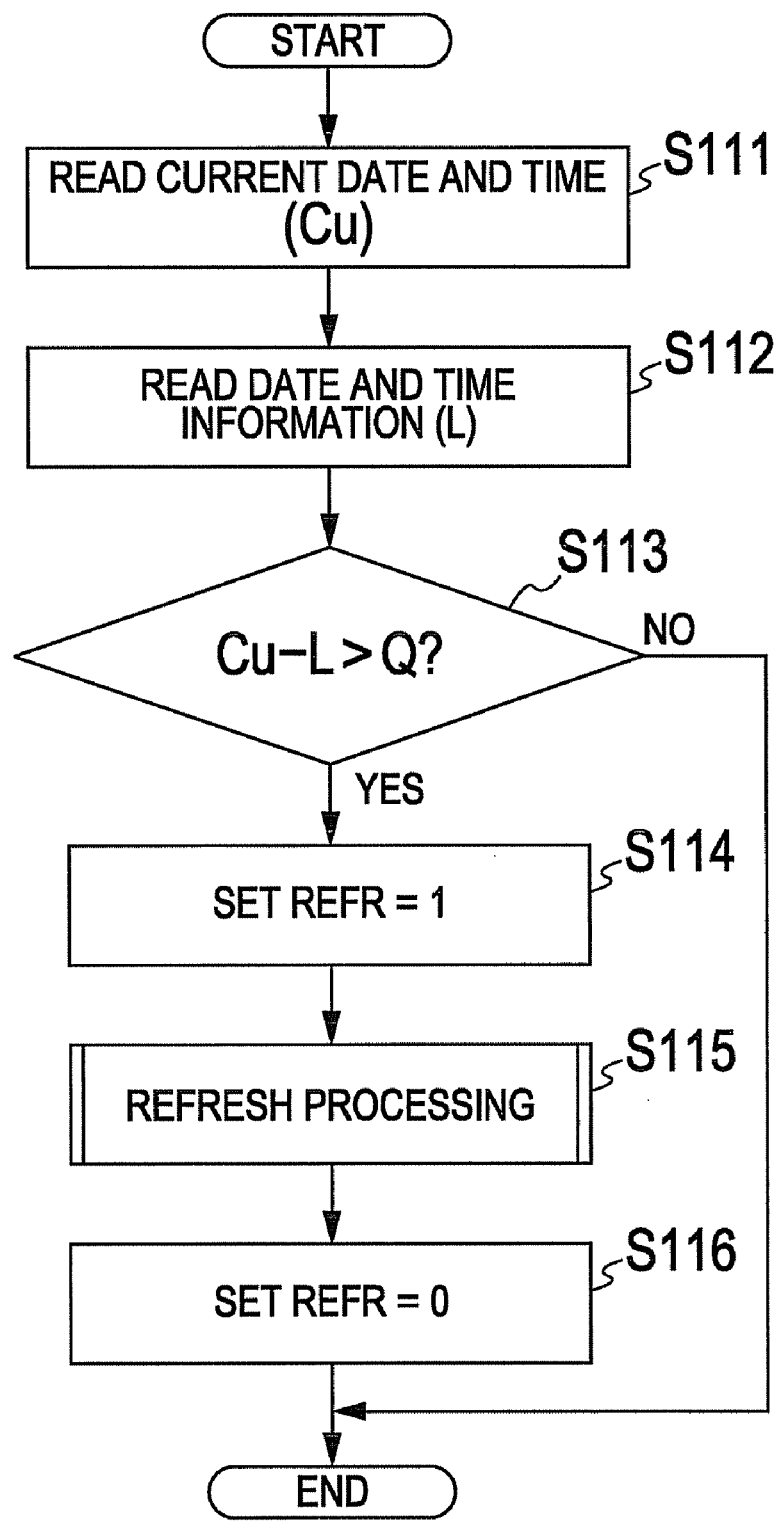
FIG. 32 is a flowchart illustrating the processing for determining whether to execute refresh processing of the seventh embodiment.
Figure 33:
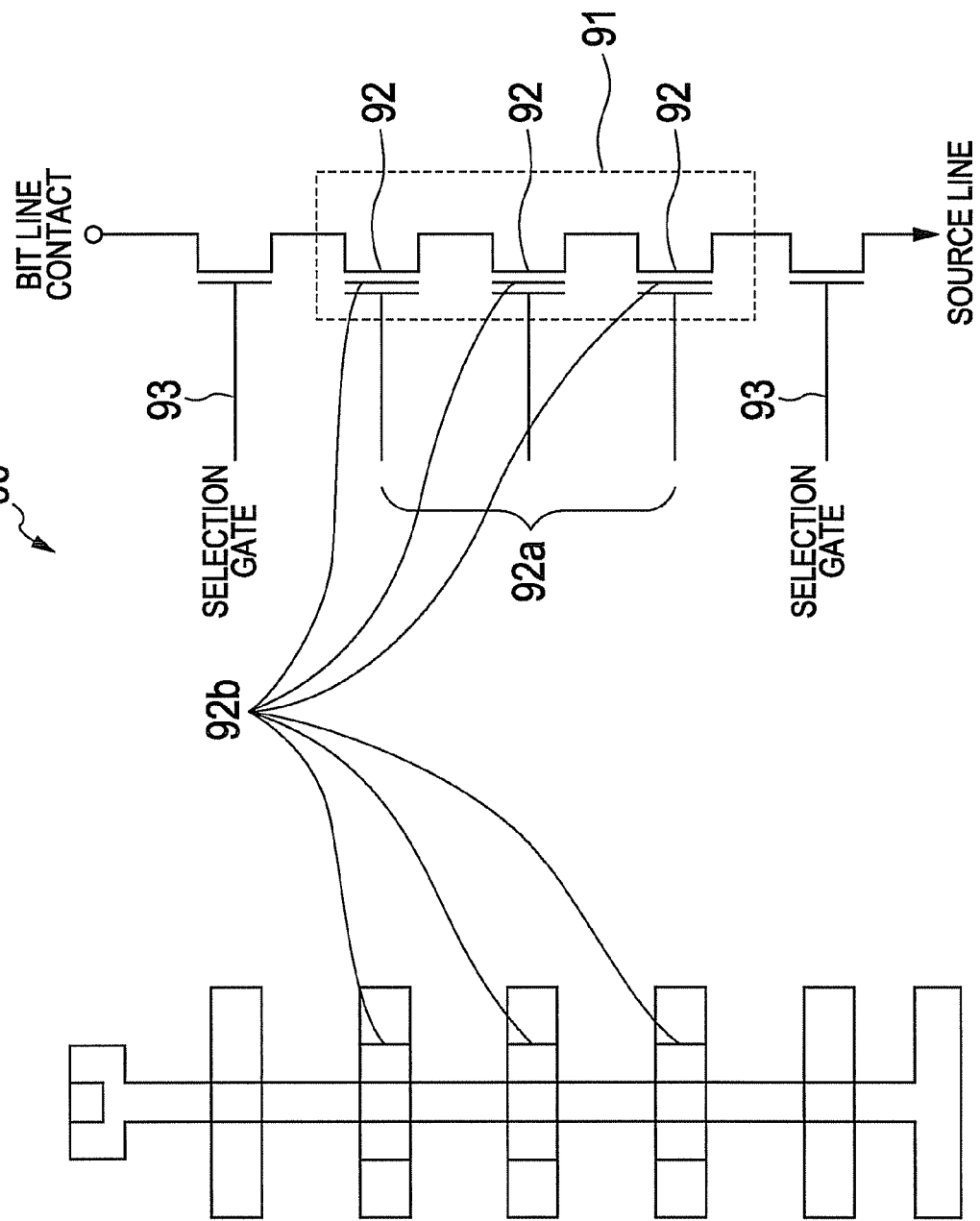
FIG. 33 is a circuit diagram illustrating the basic cell structure of a NAND nonvolatile memory.

Next, the processing for determining whether to execute refresh processing of the seventh embodiment is described. FIG. 32 is a flowchart illustrating the processing for determining whether to execute refresh processing of the seventh embodiment.

First, the I2C interface unit 218 reads current date and time information "Cu" from the real time clock IC (step S111). Next, the date and time information "L" stored in the LRD is read (step S112).

Then, a value "Cu−L" obtained by subtracting the date and time information "L" from the current date and time information "Cu" is compared with a preset value "Q" (for example, Q=7 days) to determine whether the value "Cu−L" is larger than the value "Q" (step S113).

If the value "Cu−L" is smaller than the value "Q" (No in step S113), the processing is terminated. On the other hand, if the value "Cu−L" is larger than the value "Q" (Yes in step S113), "1" is set to "REFR" of the status register 30 (step S114).

Next, refresh processing is performed (step S115). The steps of the refresh processing are the same as the refresh processing in FIG. 11. After the completion of the refresh processing, "0" is set to "REFR" of the status register 30 (step S116).

At this point, the processing is terminated. That is the end for the description about the processing for determining whether to execute refresh processing. According to the system of the seventh embodiment, the same effects as the system of the first embodiment may be obtained.

In addition, according to the system of the seventh embodiment, it is possible to certainly prevent such a situation that a potential level is lowered and the logic is inverted over time even if no data access is made. Hence, a reliability may be further enhanced.

The nonvolatile memory, the memory control unit, the memory control system, the nonvolatile memory control method of the present invention are described above by way of the illustrated embodiments. However, the present invention is not limited thereto. The structure of each component may be replaced with any structure having the same function. Further, any other structure or step may be added to the present invention.

Further, the present invention is applicable to a combination of any two or more constructions (features) in the above embodiments. Further, although the above embodiments are described based on the computer system, the present invention is applicable to a cell phone or an information processing unit such as a PDA.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments of the present invention have been described in detail, it should be understood that the various changes, substitutions, and alterations could be made hereto without departing from the spirit and scope of the invention.

What is claimed is:

1. A nonvolatile memory, comprising:
   a memory cell array including a plurality of memory cells, each of the memory cells capable of storing electric charges nonvolatilly;
   a first sense amplifier for comparing a voltage produced by one of the selected memory cells to be read out with a first threshold value for distinguishing between a write state and an erase state of the selected memory cell;
   a second sense amplifier for comparing the voltage produced by one of the selected memory cell with a second threshold value having a greater voltage than the first threshold voltage; and
   a write unit for rewriting data of the selected memory cell when the first and the second sense amplifiers produce different sense outputs from each other, wherein
   the nonvolatile memory includes a position for storing instructions,
   the nonvolatile memory reduces a first time interval to a second time interval if a plurality of access times exceed a threshold for determining a number of accesses to the memory cell,
   the first interval being a time for the voltage to be produced by one of the selected memory cell, with the second threshold value having the greater voltage than the first threshold voltage, and
   the second interval is the next time interval after the first interval being a time for the voltage to be produced by one of the selected memory cell with the second threshold value having the greater voltage than the first threshold voltage.

2. The nonvolatile memory according to claim 1, wherein one of the output of the first sense amplifier or the output result of the second sense amplifier is selected in accordance with a select signal being input.

3. The nonvolatile memory according to claim 2, further comprising a select circuit for selecting one of the output of the first sense amplifier or the output of the second sense amplifier.

4. The nonvolatile memory according to claim 2, further comprising a command register for accepting a command and outputting the select signal in accordance with the command.

5. The nonvolatile memory according to claim 1, further comprising:
   a data read unit for reading data at a block of address designated of the memory cell array; and
   a temporary store unit for temporary storing the data read by the data read unit;
   wherein the data read unit reads the data of the selected memory cell when the first and the second sense amplifiers produce the different sense outputs from each other, and the write unit rewrites the data of the selected memory cell to the block of the address after erasing the data of the block of the address.

6. The nonvolatile memory according to claim 1, further comprising:
   a data read unit for reading data at a block of address designated of the memory cell array; and
   a temporary store unit for temporary storing the data read by the data read unit;
   wherein the data read unit reads the data of the selected memory cell on a basis of plural blocks when the first and the second sense amplifiers produce the different sense outputs from each other, and the write unit rewrites data of the selected memory cell to a different block of the address, the different block of address being different from the block of the address after erasing the data of the selected memory cell of the block of the address.

7. The nonvolatile memory according to claim 1, wherein a predetermined memory cell of the block is generally set to a write position, the write position generally used for writing the data of the selected memory cell when the write unit writes the data of the selected memory cell to a block of the address, and the second sense amplifier compares a voltage produced by the memory cell at the predetermined position with the second threshold value having the greater voltage than the second threshold voltage.

8. A memory control unit, comprising:
   a nonvolatile memory including a memory cell array including a plurality of memory cells, each of the memory cells capable of storing electric charges nonvolatilly, a first sense amplifier for comparing a voltage produced by one of the selected memory cells to be read out with a first threshold value for distinguishing between a write state and an erase state of the selected memory cell, a second sense amplifier for comparing the voltage produced by one of the selected memory cell with a second threshold value having a greater voltage than the first threshold voltage, and a write unit for rewriting data of the selected memory cell when the first and the second sense amplifiers produce different sense outputs from each other; and
   a write instruction unit for instructing to write the data of the selected memory cell when the first and the second sense amplifiers produce the different sense outputs from each other, wherein
   the nonvolatile memory includes a position for storing instructions,
   the nonvolatile memory reduces a first time interval to a second time interval if a plurality of access times exceed a threshold for determining a number of accesses to the memory cell,
   the first interval being a time for the voltage to be produced by one of the selected memory cell, with the second threshold value having the greater voltage than the first threshold voltage, and
   the second interval is the next time interval after the first interval being a time for the voltage to be produced by one of the selected memory cell with the second threshold value having the greater voltage than the first threshold voltage.

9. The memory control unit according to claim 8, wherein the nonvolatile memory further includes a data read unit for reading data at a block of address designated the memory cell array, and a temporary store unit temporary storing the data read by the data read unit, and the write instruction unit instructs the data read unit to read the data of the block of the address including the data of the selected memory cell when the first and the second sense amplifiers produce the different sense outputs from each other, instructs the temporary store unit to store the data, and instructs the write unit to rewrite the data stored with the temporary store unit after erasing the data of the block of the address.

10. The memory control unit according to claim 9, wherein the nonvolatile memory further includes a data read unit for reading data at a block of address designated of the memory cell array, and a temporary store unit for temporary storing the data read by the data read unit, and the write instruction unit instructs the data read unit to read the data of the block of the address including the data of the selected memory cell when the first and the second sense amplifiers produce the different sense outputs from each other, instructs the temporary store unit to store the data, and instructs the write unit to rewrite data to a different block of the address, the different block of address being different from the block of the address after erasing the data of the block of the address.

11. The memory control unit according to claim 8, further comprising a table for managing a logical address of the block and a physical address correspondence to the logical address, wherein the write instruction unit instructs the write unit to rewrite data to the block of the address, the data stored with the temporary store unit, and update the physical address being rewritten corresponding to the logical address of the data on the table.

12. The memory control unit according to claim 9, wherein the write instruction unit instructs the write unit to write data to the predetermined position of the block when the write unit writes the data to the block of the designated address.

13. The memory control unit according to claim 8, wherein the nonvolatile memory further includes a register being set a threshold of current date and time information, the register for determining whether a predetermined time is elapsed or not, wherein the write instruction unit instructs the write unit to write the each date to a predetermined position of the nonvolatile memory cell when the second sense amplifier compares the voltage produced by one of the selected memory cell with the second threshold value having the greater voltage than the first threshold voltage, and the write instruction unit instructs the second sense amplifier to compare the voltage produced by one of the selected memory cell with the second threshold value having the greater voltage than the first threshold voltage if a difference between a current date and the date written at the predetermined position exceeds the threshold of current date and time information.

14. The memory control unit according to claim 8, wherein the nonvolatile memory further includes a register being set a threshold for determining number of accesses to the memory cell, and the write instruction unit instructs the write unit to write the number of accesses to the nonvolatile memory cell to the predetermined position of the nonvolatile memory cell, and instructs the second sense amplifier compares the voltage produced by one of the selected memory cell with the second threshold value having the greater voltage than the first threshold voltage if the access times exceed the threshold for determining number of accesses to the memory cell.

15. The memory control unit according to claim 8, wherein the nonvolatile memory further includes a register being set a flag to indicate the second sense amplifier compares the voltage produced by one of the selected memory cell with the second threshold value having the greater voltage than the first threshold voltage.

16. The memory control unit according to claim 8, wherein the write instruction unit instructs the write unit to write a number of instructions that the write instruction unit instructs the write unit to the predetermined position of the nonvolatile memory cell.

17. A memory control system, comprising:
a nonvolatile memory, including:
a memory cell array including a plurality of memory cells, each of the memory cells capable of storing electric charges nonvolatilly,
a first sense amplifier for comparing a voltage produced by one of the selected memory cells to be read out of the floating gate with a first threshold value for distinguishing between a write state and an erase state of the selected memory cell,
a second sense amplifier for comparing the voltage produced by one of the selected memory cell with a second threshold value having a greater voltage than the first threshold voltage,
a write unit for rewriting data of the selected memory cell when the first and the second sense amplifiers produce different sense outputs from each other, and
a write instruction unit, wherein the write instruction unit sends instructions to the write unit for instructing the write unit to write data of the selected memory cell when the first and the second sense amplifiers produce different sense outputs from each other; and
a display control unit for displaying a state of an operation of the memory control unit on a display, wherein
the nonvolatile memory includes a position storing the instructions,
the nonvolatile memory reduces a first time interval to a second time interval if a plurality of access times exceed a threshold for determining a number of accesses to the memory cell,
the first interval being a time for the voltage to be produced by one of the selected memory cell, with the second threshold value having the greater voltage than the first threshold voltage, and
the second interval is the next time interval after the first interval being a time for the voltage to be produced by one of the selected memory cell with the second threshold value having the greater voltage than the first threshold voltage.

18. The memory control system according to claim 17, wherein the memory control unit further includes a register being set a flag to indicate when the second sense amplifier compares the voltage of the floating gate the second sense amplifier compares the voltage produced by one of the selected memory cell with the second threshold value having the greater voltage than the first threshold voltage, and the display control unit displays an instruction on the display, the instruction including that the write instruction unit instructs the write unit to write a number of instructions instructing the write unit to a predetermined position of the nonvolatile memory cell.

* * * * *

UNITED STATES PATENT AND TRADEMARK OFFICE
CERTIFICATE OF CORRECTION

| | |
|---|---|
| PATENT NO. | : 8,391,067 B2 |
| APPLICATION NO. | : 12/623553 |
| DATED | : March 5, 2013 |
| INVENTOR(S) | : Kazunori Kasuga |

Page 1 of 1

It is certified that error appears in the above-identified patent and that said Letters Patent is hereby corrected as shown below:

In the Claims

Column 15, Line 55, In Claim 2, delete "result".

Signed and Sealed this
Second Day of July, 2013

Teresa Stanek Rea
*Acting Director of the United States Patent and Trademark Office*